(12) United States Patent
Ito

(10) Patent No.: US 7,440,326 B2
(45) Date of Patent: Oct. 21, 2008

(54) PROGRAMMING NON-VOLATILE MEMORY WITH IMPROVED BOOSTING

(75) Inventor: Fumitoshi Ito, Yokohama (JP)

(73) Assignee: SanDisk Corporation, Milpitas, CA (US)

( * ) Notice: Subject to any disclaimer, the term of this patent is extended or adjusted under 35 U.S.C. 154(b) by 132 days.

(21) Appl. No.: 11/516,976

(22) Filed: Sep. 6, 2006

(65) Prior Publication Data

US 2008/0055995 A1 Mar. 6, 2008

(51) Int. Cl.
*G11C 16/04* (2006.01)
(52) U.S. Cl. .......................... 365/185.18; 365/185.02; 365/185.17
(58) Field of Classification Search ............ 365/185.18, 365/185.02, 185.17
See application file for complete search history.

(56) References Cited

U.S. PATENT DOCUMENTS

| | | | |
|---|---|---|---|
| 5,043,940 A | 8/1991 | Harari | |
| 5,172,338 A | 12/1992 | Mehrotra et al. | |
| 5,386,422 A | 1/1995 | Endoh et al. | |
| 5,467,306 A | 11/1995 | Kaya et al. | |
| 5,570,315 A | 10/1996 | Tanaka et al. | |
| 5,621,684 A | 4/1997 | Jung et al. | |
| 5,671,176 A | 9/1997 | Jang et al. | |
| 5,677,873 A | 10/1997 | Choi et al. | |
| 5,715,194 A | 2/1998 | Hu | |
| 5,748,538 A | 5/1998 | Lee et al. | |
| 5,774,397 A | 6/1998 | Endoh | |
| 5,776,810 A | 7/1998 | Guterman et al. | |
| 5,818,757 A | 10/1998 | So | |
| 5,867,429 A | 2/1999 | Chen et al. | |
| 5,887,145 A | 3/1999 | Harari | |
| 5,973,962 A | 10/1999 | Kwon | |

(Continued)

OTHER PUBLICATIONS

J.D. Choi, et al., A Novel Booster Plate Technology in High Density NAND Flash Memories for Voltage Scaling-Down and Zero Program Disturbance, 1996 Symposium on VLSI Technology Digest of Technical Papers, pp. 238-239.

(Continued)

*Primary Examiner*—Huan Hoang
(74) *Attorney, Agent, or Firm*—Vierra Magen Marcus & DeNiro LLP

(57) ABSTRACT

Non-volatile storage elements are programmed in a manner that reduces program disturb, particularly at the edges storage elements strings, by using modified pass voltages. In particular, during the programming of a selected storage element, an isolation voltage is applied to a storage element proximate to the selected storage element thereby electrically dividing the channel associated with the storage elements into two isolated areas. Additional isolated areas are formed remotely from the selected storage element by applying the isolation voltage to other remote storage elements. The isolated channel regions associated with the storage elements are then boosted with different pass voltages in order to alleviate the effects of program disturb. Thus, a standard pass voltage is applied to storage elements immediately adjacent to the selected storage element, and a lower pass voltage is applied to storage elements remote from the selected storage element. In one preferred embodiment, a higher pass voltage is applied to storage elements immediately adjacent the selected storage element on the side having previously programmed storage elements. These techniques reduce the leakage of charge from adjacent boosted channel regions caused by gate induced drain leakage at the source select line and the drain select line, as well as from isolation word lines, thereby reducing program disturb effects.

47 Claims, 17 Drawing Sheets

U.S. PATENT DOCUMENTS

| | | | |
|---|---|---|---|
| 5,986,929 | A | 11/1999 | Suguira et al. |
| 5,991,202 | A | 11/1999 | Derhacobian et al. |
| 6,011,287 | A | 1/2000 | Itoh et al. |
| 6,028,788 | A | 2/2000 | Choi et al. |
| 6,046,935 | A | 4/2000 | Takeuchi et al. |
| 6,049,494 | A | 4/2000 | Sakui et al. |
| 6,061,270 | A | 5/2000 | Choi |
| 6,107,658 | A | 8/2000 | Itoh |
| 6,108,238 | A | 8/2000 | Nakamura et al. |
| 6,134,157 | A | 10/2000 | Takeuchi |
| 6,181,599 | B1 | 1/2001 | Gongwer |
| 6,222,762 | B1 | 4/2001 | Guterman et al. |
| 6,228,782 | B1 | 5/2001 | Fang et al. |
| 6,236,609 | B1 | 5/2001 | Tanzawa et al. |
| 6,243,295 | B1 | 6/2001 | Satoh |
| 6,307,807 | B1 | 10/2001 | Sakui et al. |
| 6,314,026 | B1 | 11/2001 | Satoh et al. |
| 6,353,555 | B1 | 3/2002 | Jeong |
| 6,363,010 | B2 | 3/2002 | Tanaka et al. |
| 6,370,081 | B1 | 4/2002 | Sakui et al. |
| 6,411,551 | B1 | 6/2002 | Kim et al. |
| 6,442,080 | B2 | 8/2002 | Tanzawa et al. |
| 6,456,528 | B1 | 9/2002 | Chen |
| 6,469,933 | B2 | 10/2002 | Choi et al. |
| 6,480,419 | B2 | 11/2002 | Lee |
| 6,493,265 | B2 | 12/2002 | Satoh et al. |
| 6,504,757 | B1 | 1/2003 | Holmer et al. |
| 6,512,703 | B2 | 1/2003 | Sakui et al. |
| 6,522,580 | B2 | 2/2003 | Chen et al. |
| 6,522,583 | B2 | 2/2003 | Kanda et al. |
| 6,525,964 | B2 | 2/2003 | Tanaka |
| 6,580,639 | B1 | 6/2003 | He et al. |
| 6,614,688 | B2 | 9/2003 | Jeong et al. |
| 6,657,892 | B2 | 12/2003 | Sakui et al. |
| 6,661,707 | B2 | 12/2003 | Choi et al. |
| 6,680,865 | B2 | 1/2004 | Watanabe |
| 6,804,150 | B2 | 10/2004 | Park et al. |
| 6,859,394 | B2 | 2/2005 | Matsunaga et al. |
| 6,859,395 | B2 | 2/2005 | Matsunaga et al. |
| 6,859,397 | B2 | 2/2005 | Lutze et al. |
| 6,888,758 | B1 | 5/2005 | Hemink et al. |
| 6,917,542 | B2 | 7/2005 | Chen et al. |
| 6,977,842 | B2 | 12/2005 | Nazarian |
| 7,099,193 | B2 * | 8/2006 | Futatsuyama .......... 365/185.17 |
| 7,120,051 | B2 | 10/2006 | Gorobets et al. |
| 2002/0110019 | A1 | 8/2002 | Satoh |
| 2003/0147278 | A1 | 8/2003 | Tanaka |
| 2004/0145024 | A1 | 7/2004 | Chen et al. |
| 2004/0255090 | A1 | 12/2004 | Guterman et al. |
| 2005/0047210 | A1 | 3/2005 | Matsunaga |
| 2005/0088890 | A1 | 4/2005 | Matsunaga |
| 2005/0174852 | A1 | 8/2005 | Hemink |
| 2005/0226055 | A1 | 10/2005 | Guterman |

OTHER PUBLICATIONS

Takeuchi, et al., A Source-line Programming Scheme for Low Voltage Operation NAND Flash Memories, 1998 Symposium on VLSI Circuits Digest of Technical Papers, pp. 37-38.

Kang-Deog Suh, et al., A 3.3V 32Mb NAND Flash Memory with Incremental Step Pulse Programming Scheme, pp. 128-129, 1995 IEEE International Solid State Circuits Conference.

S. Aritome et al., "Reliability Issues of Flash Memory Cells," Proceedings of the IEEE, New York, vol. 81, No. 5, May 1, 1993, pp. 776-788.

Jung, et al., "A 3.3V 128Mb Multi-Level NAND Flash Memory for Mass Storage Applications," ISSCC96, Session 2, Flash Memory, Paper TP 2.1, IEEE, pp. 32-33, slide supplement pp. 20-21, 346-347 (1996).

Jung, et al., "A 117-mm2 3.3-V Only 128-Mb Multilevel NAND Flash Memory for Mass Storage Applications," IEEE Journal of Solid-State Circuits, vol. 31, No. 11, Nov. 1996, pp. 1575-1583.

A. Modelli et al., "Basic feasibility constraints for multilevel CHE-programmed flashmemories," IEE Trans. on Electron Devices, vol. 48, No. 9, Sep. 2001, pp. 2032-2042.

T. Nozaki, et al., "A 1-Mb EEPROM with MONOS Memory Cell for Semiconductor Disk Application," IEEE Journal of Solid-State Circuits, vol. 26, No. 4 Apr. 1991, pp. 497-501.

U.S. Appl. No. 11/313,023, filed Dec. 19, 2005, titled, "Method for Programming Non-volatile Memory with Reduced Program Disturb Using Modified Pass Voltages," by Hemink.

U.S. Appl. No. 11/312,925, filed Dec. 19, 2005, titled, "Apparatus for Programming Non-volatile Memory with Reduced Program Disturb Using Modified Pass Voltages," by Hemink.

International Search Report and Witten Opinion, PCT Application No. PCT/US2007/077402.

* cited by examiner

Fig. 1
Fig. 2
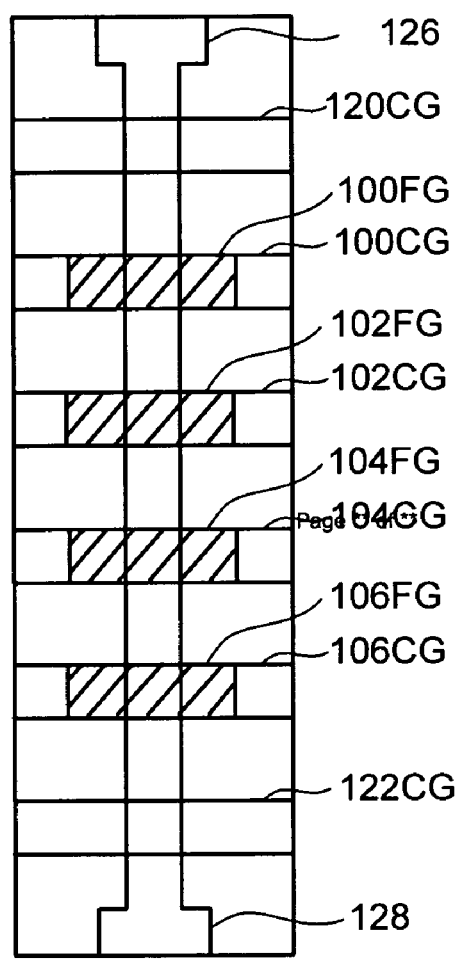
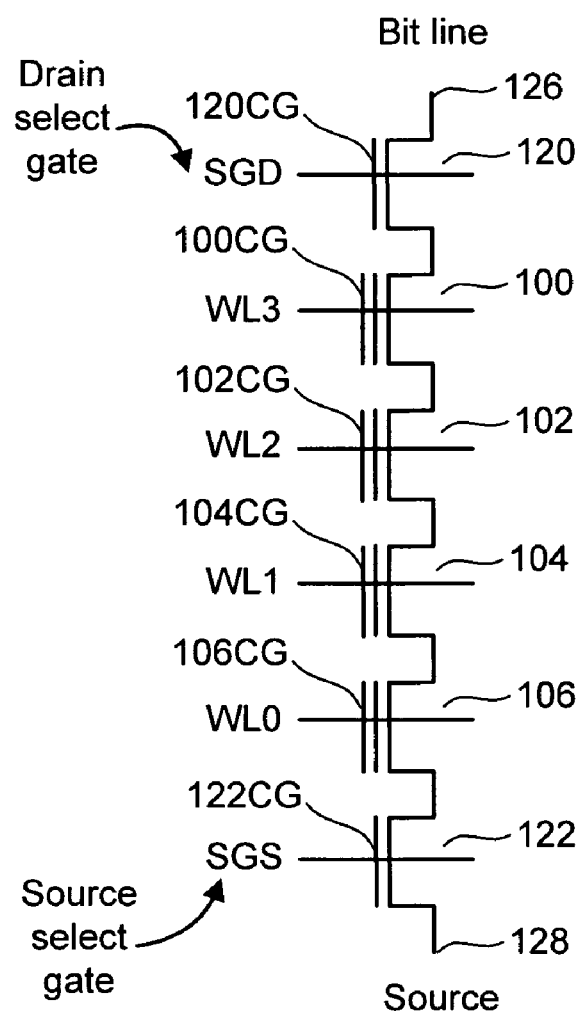

Fig. 14B

| Target WL | 0 | 1 | 2 | 3 | 4 | 5 | *** | 14 | 15 | 16 | 17 | 18 | 19 | 20 | 21 | *** | 62 | 63 |
|---|---|---|---|---|---|---|---|---|---|---|---|---|---|---|---|---|---|---|
| | | | | | | | | | | WL | | | | | | | | |
| WL0 | $V_{pgm}$ | $V_{pass}$ | $V_{pass}$ | $V_{pass}$ | $V_{pass}$ | $V_{pass}$ | | $V_{pass}$ | $V_{iso}$ | $V_{passL}$ | $V_{passL}$ | $V_{passL}$ | $V_{passL}$ | $V_{passL}$ | $V_{passL}$ | | $V_{passL}$ | $V_{passL}$ |
| WL1 | $V_{qp}$ | $V_{pgm}$ | $V_{pass}$ | $V_{pass}$ | $V_{pass}$ | $V_{pass}$ | | $V_{pass}$ | $V_{pass}$ | $V_{iso}$ | $V_{passL}$ | $V_{passL}$ | $V_{passL}$ | $V_{passL}$ | $V_{passL}$ | | $V_{passL}$ | $V_{passL}$ |
| WL2 | $V_{iso}$ | $V_{qp}$ | $V_{pgm}$ | $V_{pass}$ | $V_{pass}$ | $V_{pass}$ | | $V_{pass}$ | $V_{pass}$ | $V_{pass}$ | $V_{iso}$ | $V_{passL}$ | $V_{passL}$ | $V_{passL}$ | $V_{passL}$ | | $V_{passL}$ | $V_{passL}$ |
| WL3 | $V_{pass}$ | $V_{iso}$ | $V_{qp}$ | $V_{pgm}$ | $V_{pass}$ | $V_{pass}$ | | $V_{pass}$ | $V_{pass}$ | $V_{pass}$ | $V_{pass}$ | $V_{iso}$ | $V_{passL}$ | $V_{passL}$ | $V_{passL}$ | | $V_{passL}$ | $V_{passL}$ |
| WL4 | $V_{pass}$ | $V_{pass}$ | $V_{iso}$ | $V_{qp}$ | $V_{pgm}$ | $V_{pass}$ | | $V_{pass}$ | $V_{pass}$ | $V_{pass}$ | $V_{pass}$ | $V_{pass}$ | $V_{iso}$ | $V_{passL}$ | $V_{passL}$ | | | |
| | | | | | | | | | | | | | | | | | | |
| WL17 | $V_{passL}$ | $V_{passL}$ | $V_{passL}$ | $V_{pass}$ | $V_{pass}$ | $V_{pass}$ | | $V_{pass}$ | $V_{iso}$ | $V_{qp}$ | $V_{pgm}$ | $V_{pass}$ | $V_{pass}$ | $V_{pass}$ | $V_{pass}$ | | $V_{passL}$ | $V_{passL}$ |
| WL18 | $V_{passL}$ | $V_{passL}$ | $V_{passL}$ | $V_{passL}$ | $V_{pass}$ | $V_{pass}$ | | $V_{pass}$ | $V_{pass}$ | $V_{iso}$ | $V_{qp}$ | $V_{pgm}$ | $V_{pass}$ | $V_{pass}$ | $V_{pass}$ | | $V_{passL}$ | $V_{passL}$ |
| WL19 | $V_{passL}$ | $V_{passL}$ | $V_{passL}$ | $V_{passL}$ | $V_{passL}$ | $V_{pass}$ | | $V_{pass}$ | $V_{pass}$ | $V_{pass}$ | $V_{iso}$ | $V_{qp}$ | $V_{pgm}$ | $V_{pass}$ | $V_{pass}$ | | $V_{passL}$ | $V_{passL}$ |
| WL20 | $V_{passL}$ | $V_{passL}$ | $V_{passL}$ | $V_{passL}$ | $V_{passL}$ | $V_{iso}$ | | $V_{pass}$ | $V_{pass}$ | $V_{pass}$ | $V_{pass}$ | $V_{iso}$ | $V_{qp}$ | $V_{pgm}$ | $V_{pass}$ | | $V_{passL}$ | $V_{passL}$ |

PROGRAMMING NON-VOLATILE MEMORY WITH IMPROVED BOOSTING

CROSS-REFERENCE TO RELATED APPLICATIONS

This disclosure relates to programming non-volatile memory, and more particularly, to techniques for reducing program disturb effects during programming.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory (also a type of EEPROM), the contents of the whole memory array, or of a portion of the memory, can be erased in one step, in contrast to traditional, full-featured EEPROM.

Both EEPROM and flash memory utilize a transistor structure having a floating gate that is positioned above and insulated from a channel region in a semiconductor substrate, as well as between the source and drain regions. A control gate is provided over and insulated from the floating gate. The threshold voltage $V_t$ of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

The floating gate cap be used to store two ranges of charges, and therefore, each memory element can have two possible states, e.g., an erased state and a programmed state. Such a flash memory device is sometimes referred to as a binary flash memory device because each memory element can store one bit of data.

A multi-state or multi-level flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{pgm}$ is applied to the control gate of flash memory elements during a programming process as a series of pulses that increase in magnitude over time. In one possible approach, the magnitude of the pulses is increased with each successive pulse by a predetermined step size $\Delta V_{pgm}$, for example 0.2V-0.4V. In the periods between the program pulses, verify operations are carried out. That is, the programming level of each element of a group of elements being programmed in parallel is read between successive programming pulses and compared to a verify level indicative of the state to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{pgm}$ is applied to the control gate and the bit line is grounded, causing electrons from the channel of the memory element to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397 entitled Source Side Self Boosting Technique For Non-Volatile Memory, and in U.S. Pat. No. 6,917,542 entitled Detecting Over Programmed Memory, both of which are incorporated herein by reference in their entirety.

During programming of a selected memory element, neighboring memory elements may become inadvertently programmed in a process referred to as program disturb. For example, a memory element that is not meant to be programmed, but which is on the same word line as a memory element selected for programming, may become inadvertently programmed when $V_{pgm}$ is applied to the word line. Several techniques can be employed to prevent program disturb. For example, with self boosting (SB), the channels associated with the unselected bit lines are electrically isolated and a pass voltage (e.g., 10 V) is applied to the unselected word lines. The unselected word lines couple to the channels associated with the unselected bit lines, causing a voltage (e.g., 8 V) to exist in the channel of the unselected bit lines, which tends to reduce the program disturb effect. Thus, the self boosting technique causes a voltage boost to exist in the channel which tends to lower the voltage differential across the tunnel oxide and hence reduce the program disturb effect. Furthermore, other modified techniques, such as Local Self Boosting (LSB), Revised Local Self Boosting (RLSB), Erased Area Self Boosting (EASB), and Revised Erased Area Self Boosting (REASB), attempt to reduce program disturb by isolating the channel of previously programmed elements from the channel of the element being inhibited. For example, the REASB technique isolates the programmed side from the erased side by driving a word line near the selected word line on the programmed side with a very low isolation voltage (e.g., 0-1V), but in addition, driving a word line immediately adjacent the selected word line on the programmed side with an intermediate voltage (approx. 3 v). All other non-selected word lines are driven with a pass voltage. Thus, two separately boosted channels are created. The boosted channel voltage on the programmed side is typically lower by 1-2V than the boosted channel voltage on the erased side due to the effect of the threshold voltages in the programmed memory elements, but still adequate to boost the threshold voltage of the isolation word line.

As channel lengths in memory elements continue to decrease, the ability of conventional channel boosting techniques to reduce program disturb continues to be compromised. In particular, the channel length of the memory elements can become too short to sufficiently isolate the two separately boosted channel areas at the drain and source sides of the selected word line. As a result, the boosted channel voltage may be reduced, thereby allowing program disturb. Additionally, high electric field effects, such as band-to-band tunneling (BTBT) and gate induced drain leakage (GIDL), can cause the boosted channel to be discharged, and/or hot carriers generated by high electric field may be injected into the tunnel oxides or the floating gates of the memory elements. Thus, improved techniques for addressing the problem of program disturb continue to be needed.

SUMMARY

Techniques for reducing program disturb effects when programming non-volatile memory are disclosed. In particular, the use of multiple isolation areas divides the channel associated with a set of storage element into multiple boosting regions. Each of the word lines in the multiple boosting regions can then be biased with appropriate pass voltages to help alleviate current leakage from an adjacent boosting region caused by gate induced drain leakage on the source select line and the drain select line, as well as on isolation word lines. These techniques are particularly useful to prevent severe program disturb effects at the edges of a memory region, for example, at the higher and lower word lines of a long string NAND memory.

In one embodiment, a storage element is selected for programming. The channel associated with the set of storage elements is the divided into at least three isolated channel regions by applying an isolation voltage to one storage element that is proximate to the selected storage element and to another storage element that is remote from the selected storage element. Thus, a first and second channel region are located proximate to but on opposing sides of the selected storage element. The third channel region is remote from the selected storage element. The potential of the third channel region is boosted with a lower boosting voltage than the first and channel regions.

In a preferred embodiment, the isolation voltage is applied to a third storage element located remote from the selected storage element. Thus, a fourth channel region is created remote from the selected storage element. Further, the isolation voltage can be applied to multiple storage elements in order to create multiple isolated channel regions.

In a particularly preferred embodiment, a standard pass voltage is applied to storage elements located in correspondence with channel regions that are proximate to the selected storage element, whereas a lower pass voltage is applied to storage elements located in correspondence with channel regions remote from the selected element. In one particularly preferred embodiment, the pass voltage applied in the channel region proximate to the selected storage element is higher than the standard pass voltage.

A better understanding of the features and advantages of the present invention will be obtained by reference to the following detailed description and the accompanying drawings which set forth illustrative embodiments in which the principles of the invention are utilized.

BRIEF DESCRIPTION OF THE DRAWINGS

FIG. 1 is a top view of a NAND string of non-volatile memory.

FIG. 2 is an equivalent circuit diagram of the NAND string of FIG. 1.

FIG. 14B is a table showing bias conditions for multiple word lines using the REASB technique of FIG. 14A.

DETAILED DESCRIPTION

Figure 3:
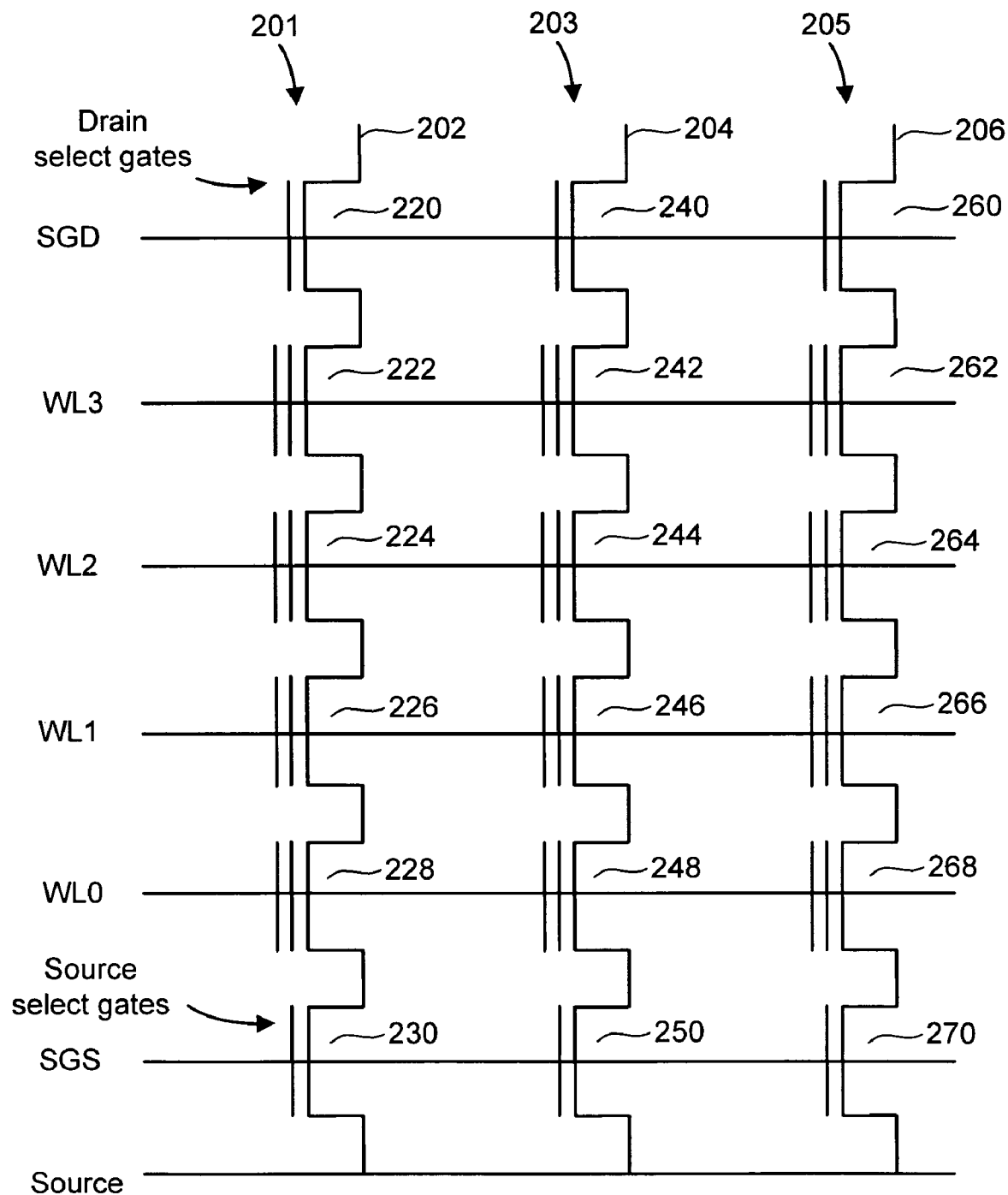
FIG. 3 is a circuit diagram depicting three NAND strings.

The present disclosure is directed to techniques for reducing program disturb, particularly at word lines located at the edges of a NAND memory string. The basic concept for reducing program disturb is to provide additional isolation regions along the NAND memory string in order to reduce the pass voltage which is applied to word lines at the edges of the NAND memory string.

One example of a non-volatile memory system suitable for implementing the present invention uses the NAND flash memory structure, in which multiple transistors are arranged in series between two select gates in a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gates 120 and 122 connect the NAND string to bit line contact 126 and source line contact 128, respectively. Select gates 120 and 122 are controlled by applying the appropriate voltages to control gates 120CG and 122CG, respectively. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gates 100CG, 102CG, 104CG and 106CG are connected to word lines WL3, WL2, WL1 and WL0, respectively. In one possible design, transistors 100, 102, 104 and 106 are each memory elements or storage elements. In other designs, the memory elements may include multiple transistors or may be different than those depicted in FIGS. 1 and 2. Select gate 120 is connected to drain select line SGD, while select gate 122 is connected to source select line SGS.

Note that although FIGS. 1-2 show four memory elements in the NAND string, the use of four transistors is provided only as an example. A NAND string used with the technology described herein can have less than four memory elements or more than four memory elements. For example, some NAND strings will include eight, sixteen, thirty-two, sixty-four or more memory elements. The discussion herein is not limited to any particular number of memory elements in a NAND string.

Generally, the invention can be used with devices that are programmed and erased by Fowler-Nordheim tunneling. The invention is also applicable to devices that use a multi layer dielectric stack, such as a dielectric formed of silicon oxide, silicon nitride and silicon oxide (ONO), or a dielectric formed of silicon oxide, a high-k layer and silicon oxide. A multi layer dielectric is sandwiched between a conductive control gate and a surface of a semi-conductive substrate above the memory element channel. The invention can also be applied to devices that use, for example, small islands of conducting materials, such as nano crystals, and a charge trap layer, such as silicon nitride, as charge storage regions instead of floating gates. Such memory devices can be programmed and erased in a similar way as floating gate based NAND flash devices.

FIG. 3 is a circuit diagram depicting three NAND strings. A typical architecture for a flash memory system using a NAND structure will include several NAND strings. For example, three NAND strings 201, 203 and 205 are shown in a memory array having many more NAND strings. Each of the NAND strings includes two select transistors and four memory elements. For example, NAND string 201 includes select transistors 220 and 230, and memory elements 222, 224, 226 and 228. NAND string 203 includes select transistors 240 and 250, and memory elements 242, 244, 246 and 248. NAND string 205 includes select transistors 260 and 270, and memory elements 262, 264, 266 and 268. Each NAND string is connected to the source line by its select transistor (e.g., select transistor 230, 250 or 270). A selection line SGS is used to control the source side select gates. The various NAND strings 201, 203 and 205 are connected to respective bit lines 202, 204 and 206, by select transistors 220, 240, 260, etc., which are controlled by drain select line SGD. In other embodiments, the select lines do not necessarily need to be in common. Word line WL3 is connected to the control gates for memory elements 222, 242 and 262. Word line WL2 is connected to the control gates for memory elements 224, 244 and 264. Word line WL1 is connected to the control gates for memory elements 226, 246 and 266. Word line WL0 is connected to the control gates for memory elements 228, 248 and 268. As can be seen, each bit line and the respective NAND string comprise the columns of the array or set of memory elements. The word lines (WL3, WL2, WL1 and WL0) comprise the rows of the array or set. Each word line connects the control gates of each memory element in the row. For example, word line WL2 is connected to the control gates for memory elements 224, 244 and 264.

Each memory element can store data. For example, when storing one bit of digital data, the range of possible threshold voltages of the memory element is divided into two ranges which are assigned logical data values "1" and "0." In one example of a NAND type flash memory, the voltage threshold is negative after the memory element is erased, and defined as logic "1." The threshold voltage after a program operation is positive and defined as logic "0." When the threshold voltage is negative and a read is attempted, the memory element will turn on to indicate logic "1" is being stored. When the threshold voltage is positive and a read operation is attempted, the memory element will not turn on, which indicates that logic "0" is stored. A memory element can also store multiple levels of information, for example, multiple bits of digital data. In this case, the range of threshold voltages is divided into the number of levels of data. For example, if four levels of information are stored, there will be four threshold voltage ranges assigned to the data values "11", "10", "01", and "00." In one example of a NAND type memory, the threshold voltage after an erase operation is negative and defined as "11". Positive threshold voltages are used for the states of "10", "01", and "00." The specific relationship between the data programmed into the memory element and the threshold voltage ranges of the element depends upon the data encoding scheme adopted for the memory elements. For example, U.S. Pat. No. 6,222,762 entitled Novel Multi-State Memory and U.S. Patent Publication No. 2004/0255090 entitled Tracking Cells For A Memory System, both of which are incorporated herein by reference in their entirety, describe various data encoding schemes for multi-state flash memory elements.

Relevant examples of NAND type flash memories and their operation are provided in the following patent references: U.S. Pat. Nos. 5,386,422; 5,570,315; 5,774,397; 6,046,935; 6,456,528; and 6,522,580; each of which is incorporated herein by reference.

When programming a flash memory element, a program voltage is applied to the control gate of the element and the bit line associated with the element is grounded. Electrons from the channel are injected into the floating gate. When electrons accumulate in the floating gate, the floating gate becomes negatively charged and the threshold voltage of the element is raised. To apply the program voltage to the control gate of the element being programmed, that program voltage is applied on the appropriate word line. As discussed above, that word line is also connected to one element in each of the other NAND strings that share the same word line. For example, when programming element 224 of FIG. 3, the program voltage $V_{pgm}$ will be applied to the control gates of elements 224, 244 and 264. A problem arises when it is desired to program one element on a word line without programming other elements connected to the same word line, for example, when it is desired to program element 224 but not element 244. Because the program voltage is applied to all elements connected to a word line, an unselected element on the word line (i.e., an element not selected for programming) may become inadvertently programmed in a process generally referred to as program disturb. For example, when programming element 224, there is a concern that the adjacent element 244 or 264 might unintentionally be programmed. Note that program disturb is most likely to occur on unselected memory elements on a word line selected for programming. However, in some cases, program disturb may also occur in memory elements on other than the selected word line.

Several techniques can be employed to prevent program disturb. With self boosting (SB), discussed previously, the channels associated with the unselected bit lines are electrically isolated and a pass voltage (e.g., 10 V) is applied to the unselected word lines during programming. The unselected word lines couple to the channels associated with the unselected bit lines, causing a voltage (e.g., 8 V) to exist in the channel of the unselected bit lines, which tends to reduce program disturb. Thus, self boosting causes a voltage boost to exist in the channel which tends to lower the voltage across the tunnel oxide and hence reduce program disturb.

A NAND string is typically programmed from the source side to the drain side, for example, from memory element 228 to memory element 222, in correspondence with the sequential arrangement of word lines from WL0 to WL3. As an example, assume that all or most of the memory elements of adjacent NAND string 203 have been programmed before those of NAND string 201. Thus, as the programming process prepares to program the last few memory elements of the NAND string 201, there is a negative charge on the floating gates of these previously programmed memory elements. As a result, the boosting potential using a standard SB technique may not be large enough in portions of the NAND string 203 to avoid program disturb effects on the elements in the adjacent NAND string 203 associated with the last few word lines. For example, when programming element 222 on NAND string 201, if elements 248, 246 and 244 on NAND string 203 were previously programmed, then each of those transistors (244, 246, 248) have a negative charge on their floating gate which will limit the boosting level of the self boosting process and allow program disturb to develop on element 242.

Local Self Boosting (LSB) and Erased Area Self Boosting (EASB) are modified techniques that attempt to address the shortcomings of conventional self boosting by isolating the channel of previously programmed elements from the channel of the element being inhibited. For example, if element 224 of FIG. 3 is being programmed, LSB and EASB attempt to inhibit programming in element 244 by isolating the channel of element 244 from the previously programmed elements (246 and 248). For the SB, EASB, and LSB boosting methods or variations of these boosting methods, the bit line for the element being programmed is connected to ground or another low voltage (typically 0-1V), while the bit line of the NAND string with the element being inhibited is at $V_{dd}$, typically in a range of 1.5-3 V. The program voltage $V_{pgm}$ (e.g., 20 V) is connected to the selected word line. In case of the LSB boosting mode, the word lines adjacent to the selected word line are set at or near 0 V while the remaining non-selected word lines are set at pass voltage $V_{pass}$. For example, bit line 202 is at 0 V and bit line 204 is at $V_{dd}$. Drain select line SGD is at $V_{sgd}$ (typically 2.5-4.5 V) and source select line SGS is at 0 V. Selected word line WL2 (for programming element 224) is at $V_{pgm}$. Neighboring word lines WL1 and WL3 are at 0 V, and other word lines (e.g., WL0) are at $V_{pass}$.

A disadvantage of the LSB mode is that the boosted channel voltage under the selected word line can be very high since that part of the channel is isolated from the other channel areas under the unselected word lines, and thus, the boosting voltage is mainly determined by the high programming voltage, $V_{pgm}$. Due to the high boosting, BTBT or GIDL can occur near the word lines that are biased to 0 V, and generated hot carriers may be injected to the selected word lines in unselected NAND strings. The amount of channel boosting can be well controlled by using the EASB method. EASB is similar to SB with the exception that only the source side neighbor of the selected word line is biased at 0 V. Thus, the channel area under the selected word line and the channel area at the drain side of the selected elements are connected, and thus, the channel boosting is stably determined by the $V_{pass}$ voltage that is applied to the unselected word lines having an erased state, because boosting is not affected by previously programmed data. If $V_{pass}$ is too low, boosting in the channel will be insufficient to prevent program disturb. If $V_{pass}$ is too high, unselected word lines in a selected NAND string (with 0 V on the bit line) may be programmed, or selected word lines in unselected NAND strings may be disturbed by GIDL. For example, WL1 would be at 0 V instead of $V_{pass}$, while WL3 would be at $V_{pass}$. In one embodiment, $V_{pass}$ is 7-10 V.

While LSB and EASB provide an improvement over self boosting, they also present a problem that depends on whether the adjacent element on the source side (element 246 is the source side neighbor of element 244) is programmed or erased. If the source side neighbor element is in a programmed state, then there is a negative charge on its floating gate. Moreover, with 0 V applied to the control gate, and in combination with the highly reverse biased junction (due to boosting) under the negatively charged gate, Gate Induced Drain Leakage (GIDL) can occur in which electrons leak into the boosted channel. GIDL occurs with a large bias over the junction, which is caused by a high voltage on the drain/source region of the memory elements due to boosting, and a low or negative gate voltage, which is precisely the case when the source side neighbor element is programmed and the drain junction is boosted. GIDL can cause the boosted voltage to leak away prematurely, resulting in a program disturb, and is more severe with the abruptly and highly doped junctions, which are required as element dimensions are scaled. If the leakage current is high enough, the boosting potential in the channel region will decrease possibly resulting in program disturb. Furthermore, the closer the word line being programmed is to the drain, the less charge is present in the boosted channel area. Thus, the voltage in the boosted channel will drop quickly, causing program disturb. Another possible side-effect of GIDL is that hot carriers, both electrons and holes, can be generated. These hot carriers may be injected into the tunnel oxide areas or into the floating gates of neighboring memory elements thus causing program disturb.

The same kind of program disturb by GIDL occurs on word lines at the edge of the NAND string, such as WL0, WL1, WL30, and WL 31 in a 32-NAND string, for instance. Because both the source and drain side select gates are biased at low voltage (typically 0V for source side and 2.5V for drain side), GIDL occurs at the select gate drain edge, which causes boosting potential to be discharged. This problem becomes more severe for longer NAND strings.

If the source side neighbor memory element is erased, then there is positive charge on the floating gate and the threshold voltage of the transistor will likely be negative. The transistor may not turn off even when 0 V is applied to the word line. If the memory element is on, then the NAND string is not operating in EASB mode. Rather, that NAND string is operating in self boosting mode, which has possible problems with insufficient boosting as discussed above. This scenario is most likely if other source side elements are programmed, which limits source side boosting. This issue is most problematic with shorter channel lengths, as leakage is more likely to occur.

Figure 4:
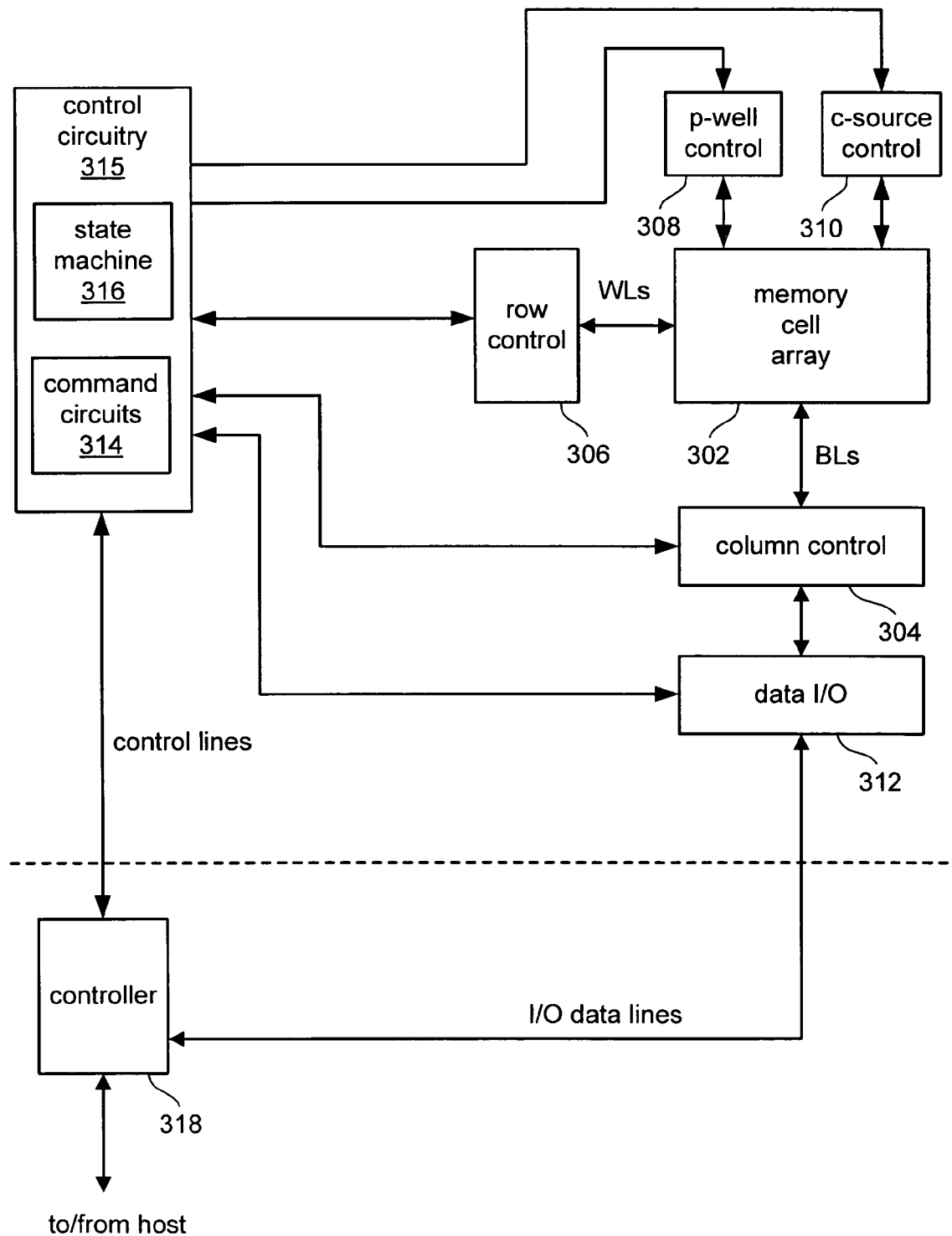
FIG. 4 is a block diagram of one embodiment of a flash memory system that can be used to implement one or more embodiments of the present disclosure.

FIG. 4 is a block diagram of one embodiment of a flash memory system that can be used to implement one or more embodiments of the present disclosure. Other systems and implementations can be used. Memory element array 302 is controlled by column control circuit 304, row control circuit 306, c-source control circuit 310 and p-well control circuit 308. Column control circuit 304 is connected to the bit lines of memory element array 302 for reading data stored in the memory elements, for determining a state of the memory elements during a program operation, and for controlling potential levels of the bit lines to promote or inhibit programming and erasing. Row control circuit 306 is connected to the word lines to select one of the word lines, to apply read voltages, to apply program voltages combined with the bit line potential levels controlled by column control circuit 304, and to apply an erase voltage. C-source control circuit 310 controls a common source line (labeled as "C-source" in FIG. 4) connected to the memory elements. P-well control circuit 308 controls the p-well voltage.

The data stored in the memory elements is read out by the column control circuit 304 and output to external I/O lines via data input/output buffer 312. Program data to be stored in the memory elements are input to the data input/output buffer 312 via the external I/O lines, and transferred to the column control circuit 304. The external I/O lines are connected to controller 318.

Command data for controlling the flash memory device is input to controller 318. The command data informs the flash memory of what operation is requested. The input command is transferred to state machine 316 which is part of control circuitry 315. State machine 316 controls column control circuit 304, row control circuit 306, c-source control 310, p-well control circuit 308 and data input/output buffer 312. State machine 316 can also output status data of the flash memory such as READY/BUSY or PASS/FAIL.

Controller 318 is connected to or connectable with a host system such as a personal computer, digital camera, personal digital assistant or the like. Controller 318 communicates with the host to receive commands, such as to store or read data to or from the memory array 302, and it provides or receives such data. Controller 318 converts the commands into command signals and sends them over control lines to be interpreted and executed by command circuits 314, which are part of control circuitry 315. Command circuits 314 are in communication with state machine 316. Controller 318 typically contains buffer memory for the user data being written to or read from the memory element array 302.

One exemplary memory system comprises one integrated circuit that includes controller 318, and one or more integrated circuit chips each containing a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g., including the controller) or just the memory array(s) with associated peripheral circuits (with the controller or control function being embedded in the host). Thus, the controller can be embedded in the host or included within the removable memory system.

In some implementations, some of the components of FIG. 4 can be combined. Further, in various designs, one or more of the components of FIG. 4, other than the memory element array 302, can be thought of as a managing circuit. For example, one or more managing circuits may include any one of, or a combination of, control circuitry, a command circuit, a state machine, a row control circuit, a column control circuit, a well control circuit, a source control circuit and a data I/O circuit.

Figure 5:
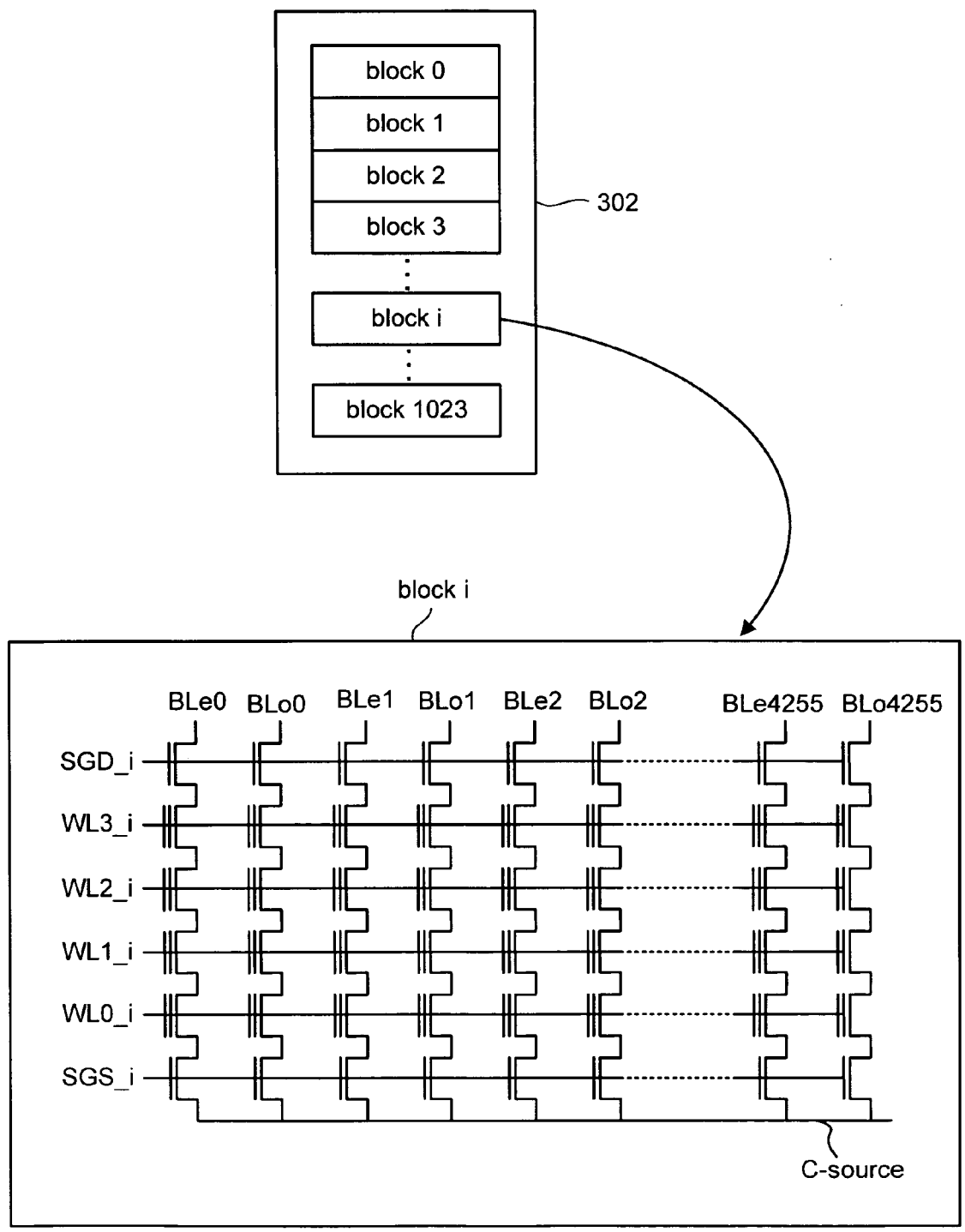
FIG. 5 illustrates an example of an organization of a memory array.

FIG. 5 provides an example structure of the memory element array 302 of FIG. 4. As one example, a NAND flash EEPROM is described that is partitioned into 1,024 blocks. In an erase operation, the data stored in each block is simultaneously erased. In one design, the block is the minimum unit of elements that are simultaneously erased. In each block, in this example, there are 8,512 columns that are divided into even columns and odd columns. The bit lines are also divided into even bit lines (BLe) and odd bit lines (BLo). Four memory elements are shown connected in series to form a NAND string. Although four elements are shown to be included in each NAND string, more or fewer than four memory elements can be used. In fact, longer string embodiments are specifically contemplated with reference to FIGS. 14-17. One terminal of the NAND string is connected to a corresponding bit line via a select transistor SGD, and another terminal is connected to the c-source line via a second select transistor SGS.

During one configuration of read and programming operations, 4,256 memory elements are simultaneously selected. The memory elements selected have the same word line and the same kind of bit line (e.g., even bit lines or odd bit lines). Therefore, 532 bytes of data, which form a logical page, can be read or programmed simultaneously, and one block of the memory can store at least eight logical pages (four word lines, each with odd and even pages). For multi-state memory elements, when each memory element stores two bits of data, where each of these two bits are stored in a different page, one block stores sixteen logical pages. Other sized blocks and pages can also be used with the present invention. Additionally, architectures other than those of FIGS. 4 and 5 can also be used to implement the present invention. For example, in one design, the bit lines are not divided into odd and even bit lines so that all bit lines can be programmed and read concurrently (or not concurrently).

Memory elements can be erased by raising the p-well to an erase voltage (e.g., 20 V) and grounding the word lines of a selected block. The source and bit lines are floating. Erasing can be performed on the entire memory array, separate blocks, or another unit of the memory elements which is a portion of the memory device. Electrons are transferred from the floating gates of the memory elements to the p-well region so that the threshold voltage of the memory elements becomes negative.

In the read and verify operations, the select gates (SGD and SGS) are connected to a voltage in a range of 2.5 to 4.5 V and the unselected word lines (e.g., WL0, WL2 and WL3, when WL1 is the selected word line) are raised to a read pass voltage (typically a voltage in the range of 4.5 to 6 V) to make the transistors operate as pass gates. The selected word line WL1 is connected to a voltage, a level of which is specified for each read and verify operation in order to determine whether a threshold voltage of the concerned memory element is above or below such level. For example, in a read operation for a two-level memory element, the selected word line WL1 may be grounded, so that it is determined whether the threshold voltage is higher than 0 V. In a verify operation for a two level memory element, the selected word line WL1 is connected to 0.8 V, for example, so that it is verified whether or not the threshold voltage has reached at least 0.8 V. The source and p-well are at 0 V. The selected bit lines, assumed to be the even bit lines (BLe), are pre-charged to a level of, for example, 0.7 V. If the threshold voltage is higher than the read or verify level on the word line, the potential level of the bit line (BLe) associated with the element of interest maintains the high level because of the non-conductive memory element. On the other hand, if the threshold voltage is lower than the read or verify level, the potential level of the concerned bit line (BLe) decreases to a low level, for example, less than 0.5 V, because the conductive memory element discharges the bit line. The state of the memory element can thereby be detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

As described above, each block can be divided into a number of pages. In one approach, a page is a unit of programming. In some implementations, the individual pages may be divided into segments and the segments may contain the fewest number of elements that are written at one time as a basic programming operation. One or more pages of data are typically stored in one row of memory elements. A page can store one or more sectors. A sector includes user data and overhead data, such as an Error Correction Code (ECC) that has been calculated from the user data of the sector. A portion of the controller calculates the ECC when data is being programmed into the array, and also checks the data using the ECC when the data is read from the array. Alternatively, the ECCs and/or other overhead data are stored in different pages, or even different blocks, than the user data to which they pertain. In other designs, other parts of the memory device, such as the state machine, can calculate the ECC.

A sector of user data is typically 512 bytes, corresponding to the size of a sector in magnetic disk drives. Overhead data is typically an additional 16-20 bytes. A large number of pages form a block that includes anywhere from 8 pages, for example, up to 32, 64 or more pages.

Figure 6:
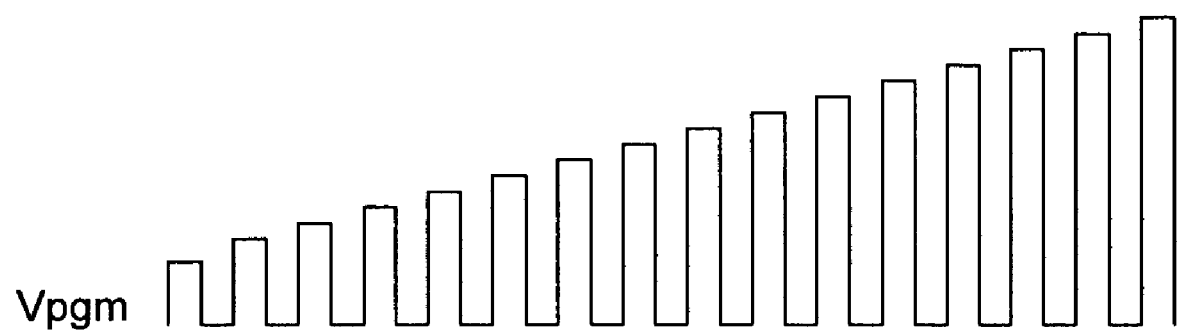
FIG. 6 depicts an example of a program voltage signal.

FIG. 6 depicts an exemplary programming pulse waveform. The programming voltage $V_{pgm}$ is divided into many pulses. The magnitude of the pulses is increased with each pulse by a predetermined step size. In one embodiment that includes the memory cells storing one bit of data, an example of a step size is 0.8 volts. In one embodiment that includes the memory cells storing multiple bits of data, an example of a step size is 0.2 volts. One example of a starting level for programming voltage $V_{pgm}$ is 12V. When attempting to inhibit a cell from being programmed, the channel is isolated by raising bit line voltage to Vdd and boosted by the pass voltage ($V_{pass}$). In some embodiments that include the memory cells storing multiple bits of data, pass voltage $V_{pass}$ may have an amplitude that does not step up.

In the periods between the pulses, verify operations are carried out. That is, the programmed level of each cell being programmed in parallel is read between each programming pulse to determine whether it is equal to or greater than the verify level to which it is being programmed. For example, if the threshold voltage is being raised to 2.5 volts, then the verify process will determine whether the threshold voltage is at least 2.5 volts. If it is determined that the threshold voltage of a given memory cell has exceeded the verify level, the bit line voltage of the NAND string for the cell is raised from 0V to $V_{dd}$. Programming of other cells being programmed in parallel continues until they in turn reach their verify levels.

Figure 7:
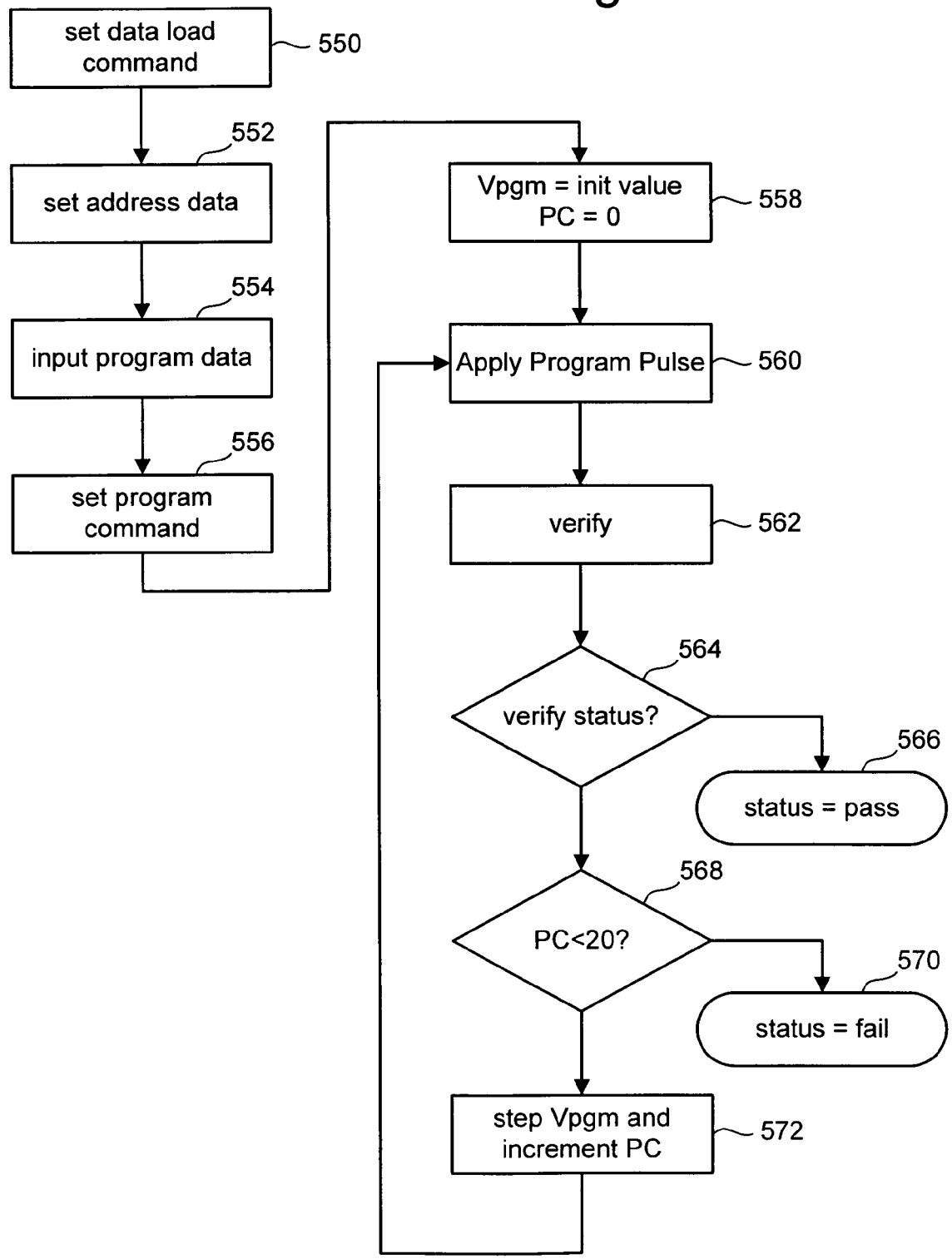
FIG. 7 is a flow chart describing one embodiment of a programming process.

FIG. 7 is a flow chart describing one embodiment of a method for programming a memory. In one implementation, memory cells are erased (in blocks or other units) prior to programming. In step 550 of FIG. 7, a "data load" command is issued by controller 318 and input to data input/output buffer 312. The input data is recognized as a command and latched by state machine 316 because a command latch signal (not illustrated) is input to command circuits 314. In step 552, address data designating the page address is input to data input/output buffer 312 from controller 318. The input data is recognized as the page address and latched by state machine 316 because the address latch signal is input to command circuits 314. In step 554, 532 bytes of program data are input to data input/output buffer 312. That data is latched into the data storage registers for the selected bit lines. In some embodiments, the data is also used for verify operations. In step 556, a "program" command is issued by controller 318 and input to data input/output buffer 312. The command is latched by state machine 316 because the command latch signal is input to command circuits 314.

Triggered by the "program" command, the data latched in the data storage registers will be programmed into the selected memory cells controlled by state machine 316 using stepped programming as in FIG. 6 pulses. In step 558, $V_{pgm}$ is initialized to the starting pulse (e.g., 12V) and a program counter PC maintained by state machine 316 is initialized at 0. In step 560, the first $V_{pgm}$ pulse is applied to the selected word line. If logic "0" is stored in a particular data storage register, then the corresponding bit line is grounded. On the other hand, if logic "1" is stored in the data storage register, then the corresponding bit line is connected to Vdd to inhibit programming.

In step 562, the states of the selected memory cells are verified. If it is detected that the target threshold voltage of a selected cell has reached the appropriate level (e.g. the programmed level for logic "0" or a particular state of a multistate cell), then the data stored in is changed to a logic "1." If it is detected that the threshold voltage has not reached the appropriate level, the data stored in the data storage register is not changed. In this manner, a bit line having a logic "1" stored in its corresponding data storage register does not need to be programmed. When all of the data storage registers are storing logic "1," the state machine knows that all selected cells have been programmed. In step 564, it is checked whether all of the data storage registers are storing logic "1." If so, the programming process is complete and successful because all selected memory cells were programmed and verified. A status of "PASS" is reported in step 366.

If, in step 564, it is determined that not all of the data storage registers are storing logic "1," then the programming process continues. In step 568, the program counter PC is checked against a program limit value. On example of a program limit value is 20. If the program counter PC is not less than 20, then the program process has failed and a status of "FAIL" is reported in step 570. If the program counter PC is less than 20, then the $V_{pgm}$ level is increased by the step size and the program counter PC is incremented in step 572. After step 572, the process loops back to step 560 to apply the next $V_{pgm}$ pulse.

Figure 8A:
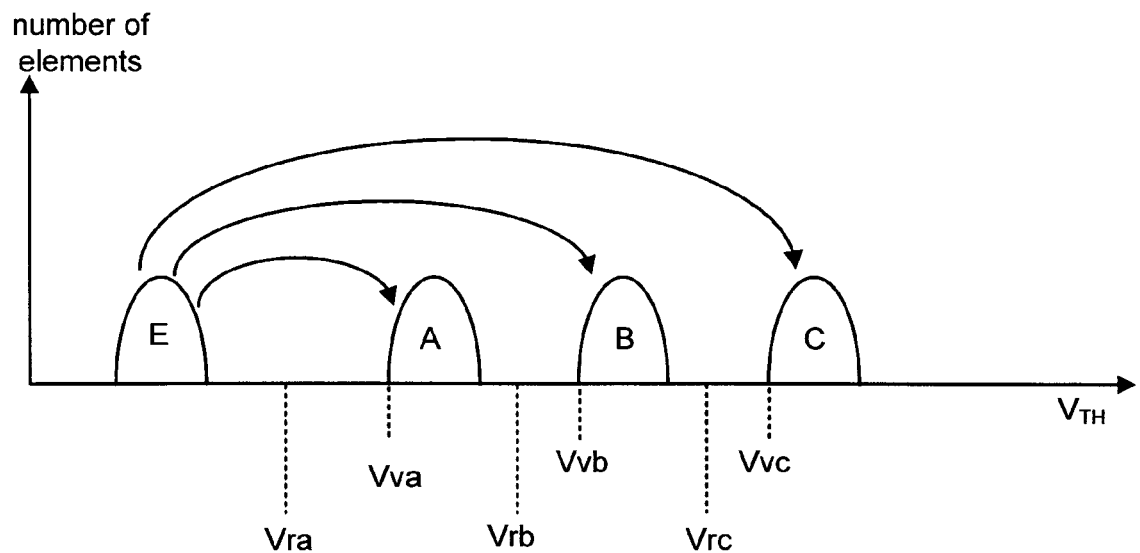
FIG. 8A depicts an example set of threshold voltage distributions in a multi-state device with direct programming from the erased state to a programmed state.

The process depicted in FIG. 7, or variations thereof, can be realized through a variety of programming methods. For example, FIG. 8A illustrates threshold voltage distributions for the memory element array when each memory element stores two bits of data. E depicts a first threshold voltage distribution for erased memory elements. A, B and C depict three threshold voltage distributions for programmed memory elements. In one design, the threshold voltages in the E distribution are negative and the threshold voltages in the A, B and C distributions are positive.

Each distinct threshold voltage range corresponds to predetermined values for the set of data bits. The specific relationship between the data programmed into the memory element and the threshold voltage levels of the element depends upon the data encoding scheme adopted for the elements. One example assigns the logical data value "11" to the threshold voltage range E (state E), "10" to the threshold voltage range A (state A), "00" to the threshold voltage range B (state B) and "01" to the threshold voltage range C (state C). However, in other designs, other schemes may be used.

In step 562 of FIG. 7, three read reference voltages, Vra, Vrb and Vrc, are used for reading data from memory elements. By testing whether the threshold voltage of a given memory element is above or below Vra, Vrb and Vrc, the system can determine the state of the memory element. Three verify reference voltages, Vva, Vvb and Vvc are also indicated. When programming memory elements to state A, B or C, the system will test whether those memory elements have a threshold voltage greater than or equal to Vva, Vvb or Vvc, respectively, as in step 562 of FIG. 7.

In one approach, known as full sequence programming, memory elements can be programmed from the erase state E directly to any of the programmed states A, B or C (as depicted by the curved arrows). For example, a population of memory elements to be programmed may first be erased so that all memory elements in the population are in the erased state E. While some memory elements are being programmed from state E to state A, other memory elements are being programmed from state E to state B and/or from state E to state C. The memory cells can be programmed as deposited on FIG. 8A using the process of FIG. 7.

Figure 8B:
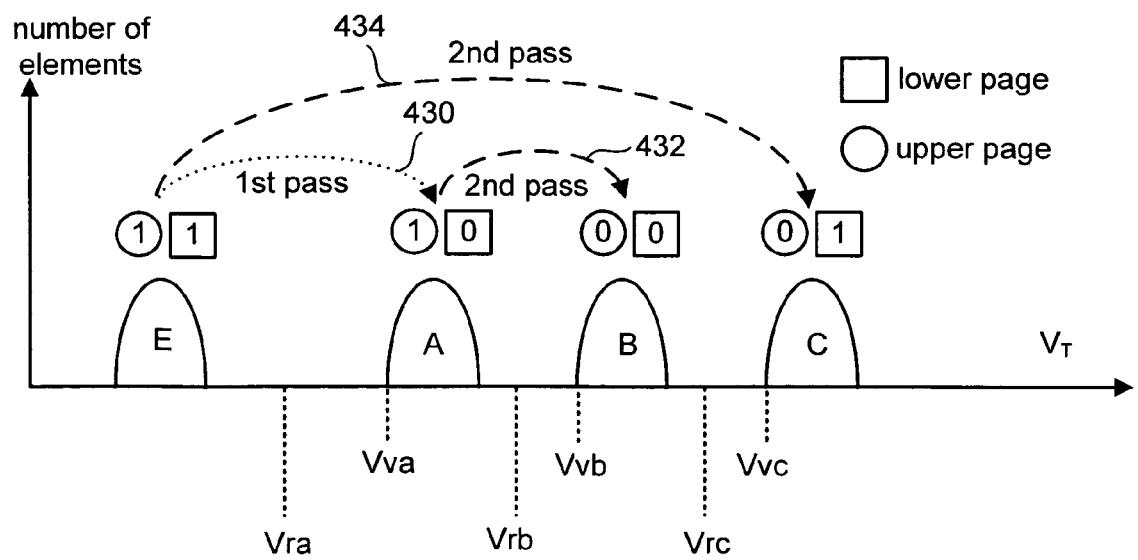
FIG. 8B depicts an example set of threshold voltage distributions in a multi-state device with two-pass programming from the erased state to a programmed state.

FIG. 8B illustrates an example of a two-pass technique for programming a multi-state memory element that stores data for two different pages: a lower page and an upper page. Four states are depicted: state E (11), state A (10), state B (00) and state C (01). For state E, both pages store a "1." For state A, the lower page stores "0" and the upper page stores "1." For state B, both pages store "0." For state C, the lower page stores "1" and the upper page stores "0." Note that although specific bit patterns have been assigned to each of the states, different bit patterns may also be assigned. Both programming passes can be implemented using the process of FIG. 7. In a first programming pass, the element's threshold voltage level is set according to the bit to be programmed into the lower logical page. If that bit is logic "1," the threshold voltage is not changed since it is in the appropriate state as a result of having been previously erased. However, if the bit to be programmed is logic "0," the threshold level of the element is increased to be state A, as shown by arrow 430. That concludes the first programming pass.

In a second programming pass, the element's threshold voltage level is set according to the bit being programmed into the upper logical page. If the upper logical page bit is to store logic "1," then no programming occurs since the element is in one of the states E or A, depending upon the programming of the lower page bit, both of which carry an upper page bit of "1." If the upper page bit is to be logic "0," then the threshold voltage is shifted. If the first pass resulted in the element remaining in the erased state E, then, in the second pass, the element is programmed so that the threshold voltage is increased to be within state C, as depicted by arrow 434. If the element had been programmed into state A as a result of the first programming pass, then the memory element is further programmed in the second pass so that the threshold voltage is increased to be within state B, as depicted by arrow 432. The result of the second pass is to program the element into the state designated to store logic "0" for the upper page without changing the data for the lower page.

In one approach, a system can be set up to perform full sequence writing if enough data is written to fill up an entire page. If not enough data is written for a full page, then the programming process can program the lower page with the data received. When subsequent data is received, the system will then program the upper page. In yet another approach, the system can start writing in the mode that programs the lower page and convert to full sequence programming mode if enough data is subsequently received to fill up all, or most of, a word line's memory elements. More details of such an approach are disclosed in U.S. Pat. No. 7,120,051 entitled Pipelined Programming of Non-Volatile Memories Using Early Data, incorporated herein by reference in its entirety.

Figure 9A:
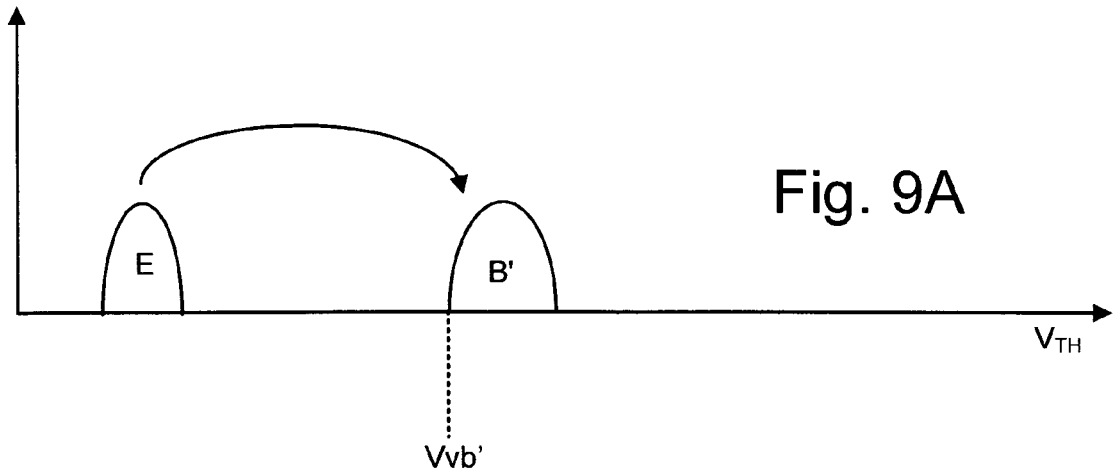
FIGS. 9A-C show various threshold voltage distributions and describe a process for programming non-volatile memory.
Figure 9B:
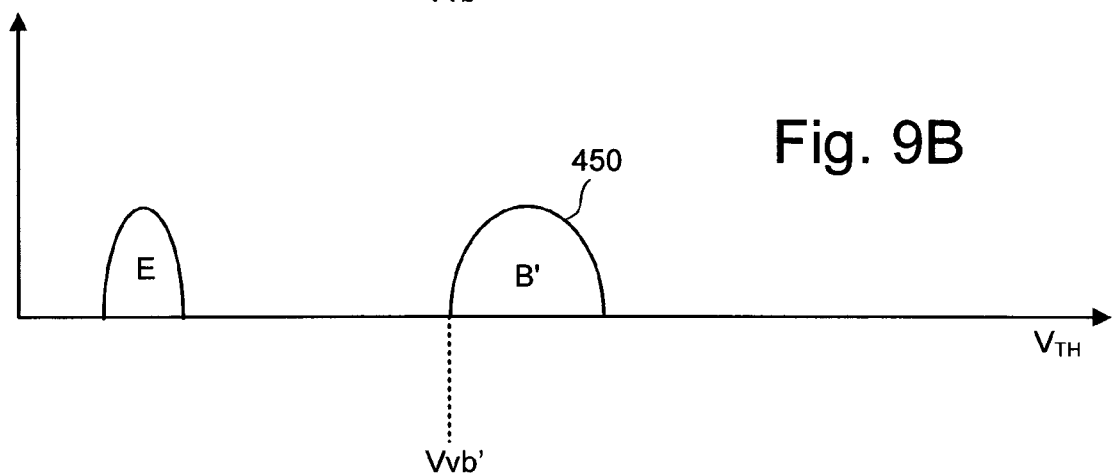
Figure 9C:
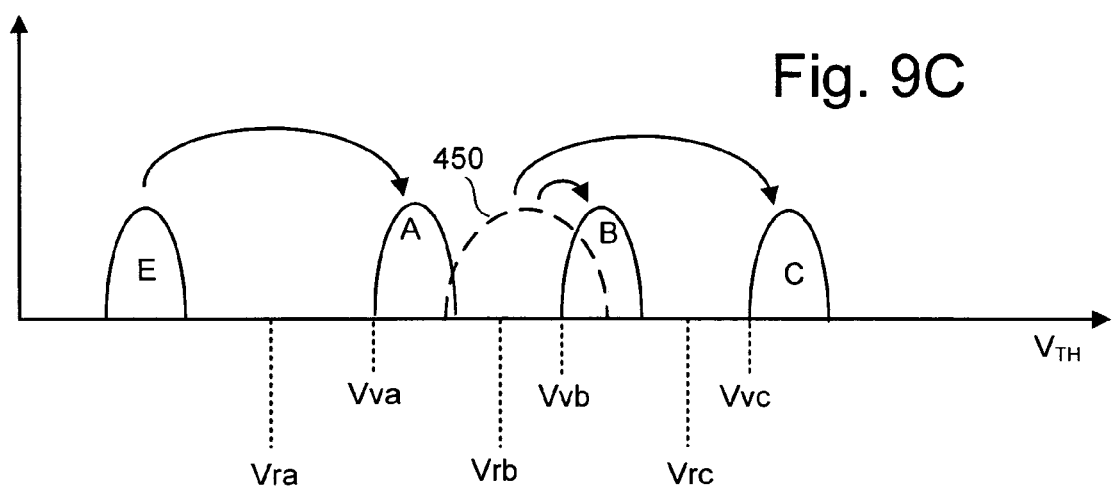

FIGS. 9A-C depict another process for programming non-volatile memory that reduces floating gate-to-floating gate coupling by, for any particular memory element, writing to that particular memory element with respect to a particular page subsequent to writing to adjacent memory elements for previous pages. In one example implementation, each of the non-volatile memory elements store two bits of data, using four data states. For example, assume that state E is the erased state and states A, B and C are the programmed states. State E stores data 11, state A stores data 01, state B stores data 10 and state C stores data 00. This is an example of non-Gray coding because both bits change between adjacent states A and B. Other encodings of data to physical data states can also be used. Each memory element stores bits from two pages of data. For reference purposes, these pages of data will be called upper page and lower page; however, they can be given other labels. For state A, the upper page stores bit 0 and the lower page stores bit 1. For state B, the upper page stores bit 1 and the lower page stores bit 0. For state C, both pages store bit data 0. The programming process has two steps. Both steps can be implemented using the process of FIG. 7. In the first step, the lower page is programmed. If the lower page is to remain data 1, then the memory element state remains at state E. If the data is to be programmed to 0, then the voltage threshold $V_{TH}$ of the memory element is raised such that the memory element is programmed to state B'. FIG. 9A therefore shows the programming of memory elements from state E to state B', which represents an interim state B; therefore, the verify point is depicted as Vvb', which is lower than Vvb, depicted in FIG. 9C.

In one design, after a memory element is programmed from state E to state B', its neighboring memory element on an adjacent word line is programmed with respect to its lower page. After programming the neighbor memory element, the floating gate-to-floating gate coupling effect will raise the apparent threshold voltage of memory element under consideration, which is in state B'. This will have the effect of widening the threshold voltage distribution for state B' to that depicted as threshold voltage distribution 450 in FIG. 8B. This apparent widening of the threshold voltage distribution will be remedied when programming the upper page.

FIG. 9C depicts the process of programming the upper page. If the memory element is in erased state E and the upper page is to remain at 1, then the memory element will remain in state E. If the memory element is in state E and its upper page data is to be programmed to 0, the threshold voltage of the memory element will be raised so that the memory element is in state A. If the memory element is in state B' with the intermediate threshold voltage distribution 450 and the upper page data is to remain at 1, the memory element will be programmed to final state B. If the memory element is in state B' with the intermediate threshold voltage distribution 450 and the upper page data is to become data 0, the threshold voltage of the memory element will be raised so that the memory element is in state C. The process depicted by FIGS. 9A-C reduces the effect of floating gate-to-floating gate coupling because only the upper page programming of neighbor memory elements will have an effect on the apparent threshold voltage of a given memory element. An example of an alternate state coding is to move from distribution 450 to state C when the upper page data is a 1, and to move to state B when the upper page data is a 0. Although FIGS. 9A-C provide an example with respect to four data states and two pages of data, the concepts taught can be applied to other implementations with more or fewer than four states and more or fewer than two pages. More detail about various programming schemes and floating gate-to-floating gate coupling can be found in U.S. patent application Ser. No. 11/099,133, entitled Compensating For Coupling During Read Operations Of Non-Volatile Memory, incorporated herein by reference in its entirety.

Figure 9D:
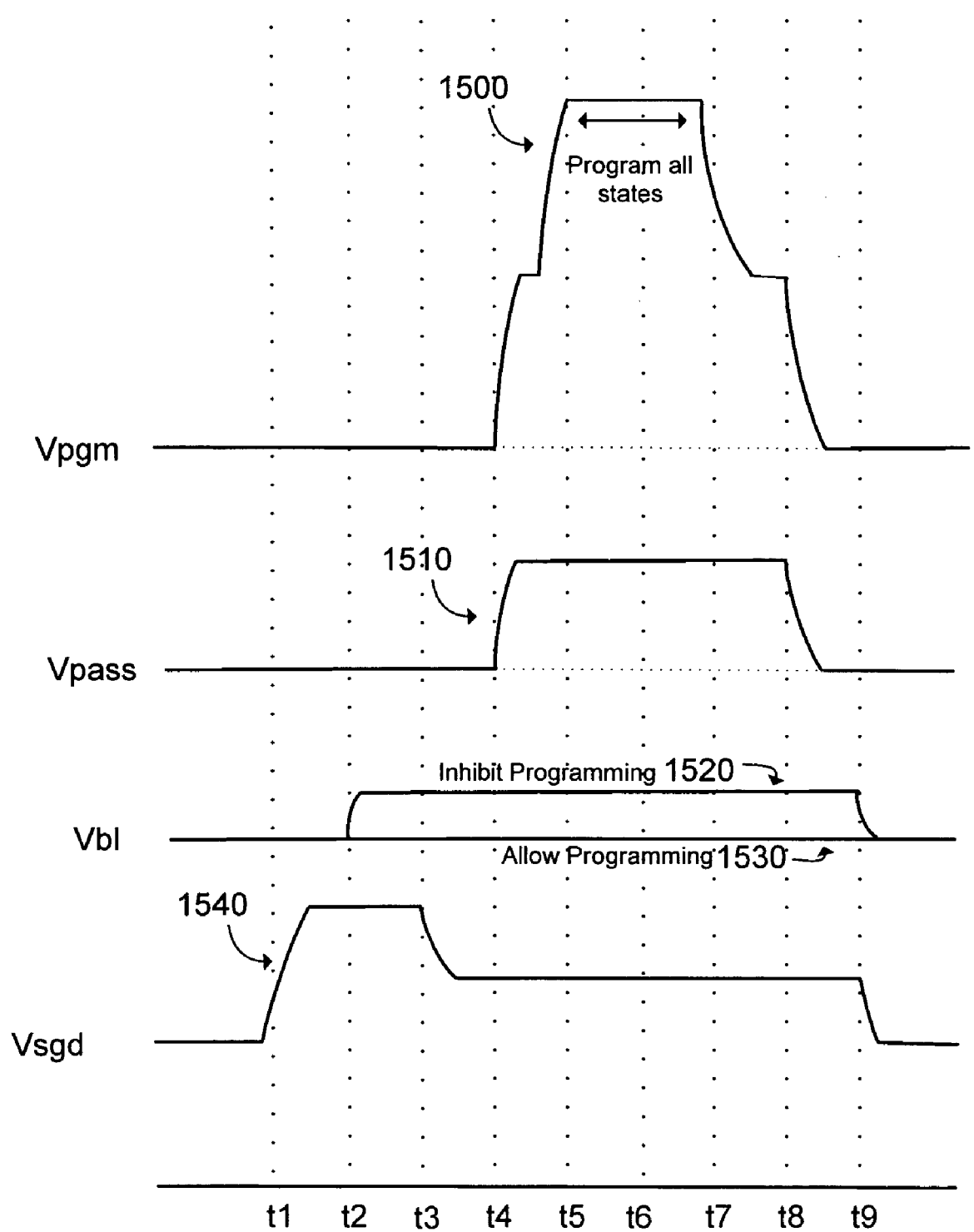
FIG. 9D is a timing diagram illustrating a typical programming process.

FIG. 9D depicts a typical timing diagram for applying a program pulse as part of step 560 of FIG. 7. Signal 1500 depicts the programming voltage waveform, $V_{pgm}$, which is applied to a word line associated with storage elements that are currently being programmed, and Signal 1510 depicts a pass voltage, $V_{pass}$, which is applied to other word lines. Signal 1520 depicts the bit line voltage, $V_{BL}$, for a storage element which is inhibited from being programmed while $V_{pgm}$ is applied, and Signal 1530 depicts the bit line voltage for a storage element which is allowed to be programmed when $V_{pgm}$ is applied. Signal 1540 depicts the drain side select gate voltage, $V_{SGD}$, of a NAND string.

At $t_1$, the drain side select gate is opened by applying a relatively high voltage, e.g., 3-4.5 V. Note that the source side select gate remains biased at 0 V. Subsequently, at $t_2$, the bit line voltage $V_{BL}$ is applied for either programming a storage element, in which case $V_{BL}$ is at or near 0 V, or in the 0-1 V range for a coarse/fine verify method, or inhibiting the storage element from programming by applying a voltage $V_{dd}$, typically a voltage from 1.5-3 V. When bit line voltage $V_{BL}$ is 0 V or another low voltage (curve 1530), this voltage will be transferred to the channel area of the storage element to be programmed. In case a higher bit line voltage $V_{BL}$ is applied (curve 1520), the channel will reach a higher voltage (Vdd in the ideal case). At $t_3$, $V_{SGD}$ is lowered to cut off the select gate in case the bit line is at Vdd while still keeping the select gate in a conducting state for the lower $V_{BL}$ in the 0-1 V range. At $t_4$, $V_{pass}$ is applied to the selected word line, and to all, or almost all, of the unselected word lines of the NAND string.

At $t_5$, the high programming voltage $V_{pgm}$ is applied to the selected word line, and, depending on whether the channel is boosted to a high voltage or biased to a low voltage, the storage element will be inhibited from programming or allowed to be programmed, respectively. Actual programming of all states will mainly take place from $t_6$ to $t_7$, after program voltage $V_{pgm}$ has increased to the fixed amplitude level. At $t_7$, program voltage $V_{pgm}$ is ramped down, and at $t_8$, $V_{pass}$ is ramped down as well. Note that program voltage $V_{pgm}$ can ramp up to its fixed amplitude and/or back down without stopping at pass voltage $V_{pass}$. Finally, at $t_9$, $V_{SGD}$ and $V_{BL}$ are removed as well. Subsequently, one or more verify operations, essentially read operations, can be performed to verify whether the storage elements that have been selected for programming have reached their target threshold voltage states. Additional programming pulses with increased amplitudes can be applied until all or almost all storage elements have reached their desired threshold voltage state.

As previously noted, various boosting methods can be used when programming non-volatile memory devices such as NAND flash memory devices. For example, at $t_4$, an appropriate boost voltage is applied to all (or almost all) unselected word lines to inhibit or allow programming. Thus, when programming is actually taking place during $t_6$ and $t_7$, the desired boosting will be present. FIGS. 10-17 illustrate a variety of boosting methods that achieve different results and show the state of certain word line voltages at time $t_6$. Self boosting (SB) can be used for binary devices since it allows word lines in one NAND string to be programmed in a random order. For multi-level devices, however, random order programming is typically not used. In this case, LSB and EASB or variations of these methods can be used. An advantage of LSB and EASB based methods is that channel boosting is more efficient and, therefore, program disturb can be reduced. However, as the dimensions of memory elements scale downward, band-to-band tunneling or GIDL can occur near the drain of the grounded word line. The boosted channel can be discharged by GIDL, causing program disturb, or hot carriers may be generated that are injected in the tunnel oxides or the floating gates of the memory elements. The problem is illustrated with reference to FIG. 10.

Figure 10:
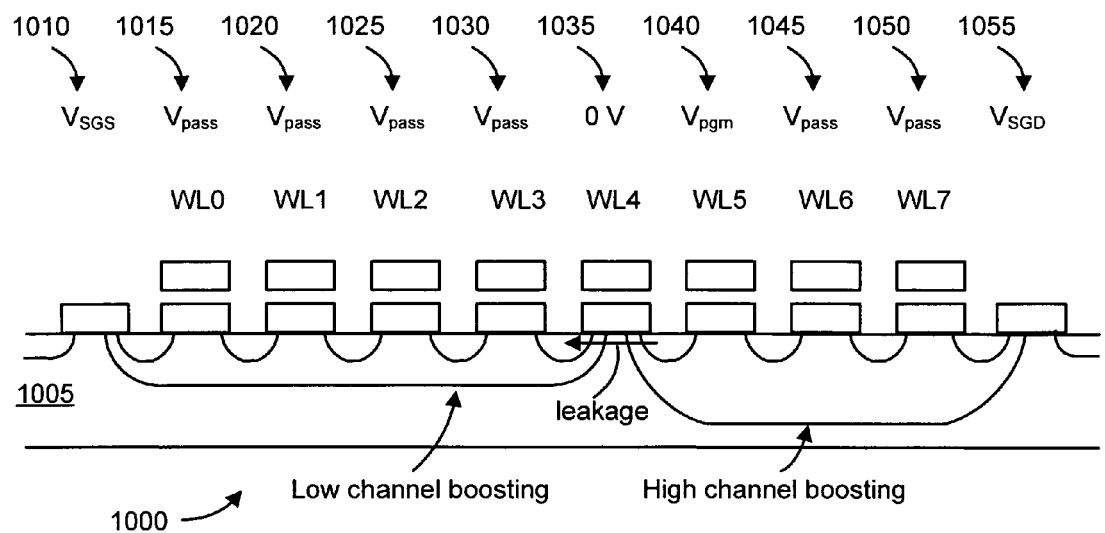
FIG. 10 illustrates a NAND string with unbalanced boosted channel regions when the EASB boosting mode is used.

FIG. 10 illustrates a NAND string 1000 having unbalanced boosted channel regions when the EASB boosting mode is used. The NAND string 1000 includes a source side select gate 1010, drain side select gate 1055, and memory elements 1015, 1020, 1025, 1030, 1035, 1040, 1045 and 1050, which are coupled to word lines WL0-WL 7, respectively, between the select gates in a p-well region 1005. Although eight memory elements are shown here, the arrangement is illustrative only and other configurations may be used. As mentioned, in one possible approach, programming may begin at the source side memory element, e.g., element 1015, and progress one memory element at a time to the drain side memory element 1050. In this example, memory element 1040 is the selected memory element that is currently being programmed, and it receives the programming voltage $V_{pgm}$ via word line WL5. A pass voltage $V_{pass}$, typically in the range of 5-10 V, is applied to the remaining memory elements via their respective word lines, except for element 1035, which receives a low voltage typically 0 V or in the range of 0-1 V. In this example, memory elements 1015, 1020, 1025, 1030 and 1035 have already been programmed, and memory elements 1045 and 1050 have not yet been programmed, or at least have not yet reached their final programmed state. That is, the memory elements 1045 and 1050 are unprogrammed and/or partially programmed. In some cases, as with the programming scheme depicted in FIG. 9, the memory element 1045 may be in the intermediate programmed state B'. Furthermore, adjacent memory element 1035 may also be in an intermediate programmed state in case of the programming scheme of FIG. 9. In another possible programming approach, the adjacent memory element 1035 has only been partially programmed when the memory element 1040 is being programmed.

Furthermore, a bit line contact associated with the NAND string 1000 can be grounded, or coupled to an intermediate voltage (typically in the range of 0.2 to 1 V) for fine mode programming, while the memory elements are being programmed. For example, see U.S. Pat. No. 6,888,758 entitled Programming Non-Volatile Memory which is expressly incorporated herein by reference. After memory element 1040 on the selected word line in the NAND string 1000 has been programmed to the desired state, an inhibit voltage $V_{dd}$ can be applied to the bit line contact to inhibit memory element 1040 from further programming until other memory elements located on other NAND strings connected to the same selected word line have been programmed to the desired state as well.

Due to the application of the pass voltages, a low channel boosting region is formed under the previously programmed memory elements, e.g., on the source side of the selected word line of NAND string 1000, while a high channel boosting region is formed under the selected memory element and the unprogrammed and/or partially programmed memory elements, e.g., on the drain side of the selected word line of NAND string 1000. These boosted regions are illustrated diagrammatically in FIG. 10. Generally, memory elements that have been programmed to a certain state cause the boosting of an associated channel region under those memory elements to be less effective. Moreover, as additional memory elements are programmed from the source side to the drain side, the poorly boosted region will increase in size while the size of the highly boosted region of unprogrammed and/or partly programmed memory elements decreases. Due to the difference in the boosted channel potentials and small substrate bias effect by poorly boosted source side region, charge may leak from the high boosted channel region to the low boosted channel region, causing the potential in the high boosted region to decrease. As a result, the likelihood of program disturb for the unselected memory elements located on the selected word line will increase. This leakage of charge from the high boosted region to the low boosted region can be prevented by increasing the boosted channel potential in the already programmed region. This can be achieved, in one approach, by using a higher $V_{pass}$ value for the word lines associated with the memory elements that have already been programmed, as illustrated in connection with FIG. 11.

Figure 11:
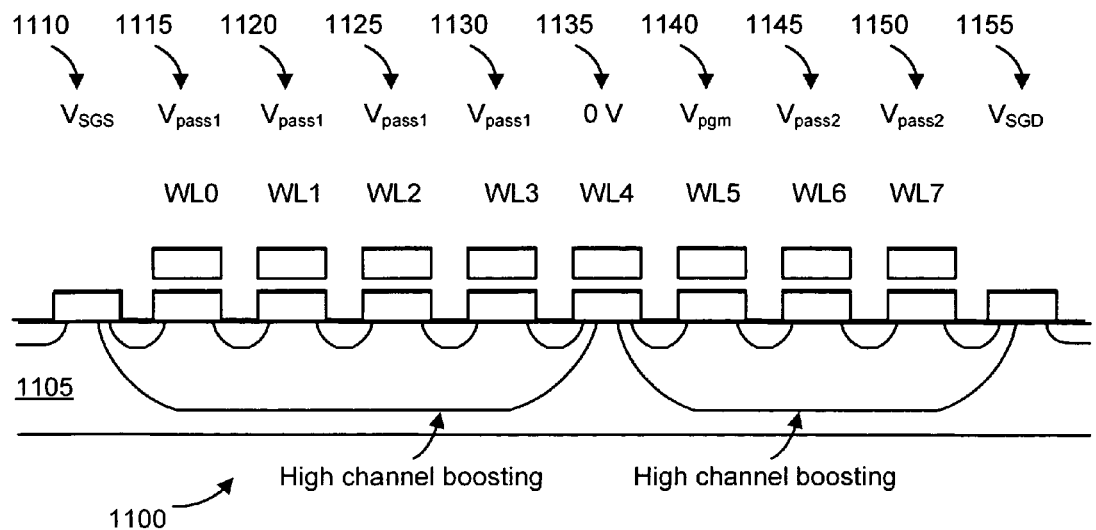
FIG. 11 illustrates a NAND string with balanced boosted channel regions.

FIG. 11 illustrates a NAND string 1100 with balanced boosted channel regions. The NAND string 1100 includes a source side select gate 1110, drain side select gate 1155, and memory elements 1115, 1120, 1125, 1130, 1135, 1140, 1145 and 1150, which are coupled to word lines WL0-WL7, respectively, between the select gates in a p-well region 1105. In one possible approach, programming begins at the source side memory element, e.g., memory element 1115, and progresses one memory element at a time to the drain side memory element 1150. In this example, memory element 1140 is the selected memory element that is currently being programmed, and it receives the programming voltage $V_{pgm}$ via word line WL5. A higher pass voltage $V_{pass1}$ is applied to the previously programmed memory elements, e.g., memory elements 1115, 1120, 1125 and 1130 via word lines WL0, WL1, WL2, and WL3, respectively, with the exception of the source side memory element 1135, which receives 0 V via word line WL4. A lower pass voltage $V_{pass2}$ is applied to the unprogrammed memory elements or to memory elements that have not yet reached their final programmed state at the drain side of the selected memory element, e.g., memory elements 1145 and 1150, via word lines WL6 and WL7, respectively. Thus, in this example, $V_{pass1}$ and $V_{pass2}$ are applied to respective subsets of the memory elements in the NAND string, where each subset includes one or more memory elements located on opposing sides of the memory element that is currently being programmed, but not necessarily all of the memory elements on the opposing sides of the memory element that is currently being programmed. As mentioned before, the memory element adjacent to the selected memory element, memory element 1145 in this example, may be in an intermediate programmed state B' in case the programming scheme of FIG. 9 is used. Furthermore, memory element 1135 may also be in an intermediate programmed state in case of the programming scheme of FIG. 9.

In practice, a low voltage (approx. 0-1 V) is applied to the adjacent source side memory element 1135 via word line WL4. Since leakage is reduced by a more equal boosting on the drain and source side and sufficient substrate bias effect caused by improved source side boosting, the boosted potential may still be high enough. Applying a bias higher than 0 V on the adjacent word line will reduce GIDL, which can occur on the adjacent word line.

Thus, boosting is improved for the channel region that corresponds with the memory elements that already have been programmed. In particular, high channel boosted regions are formed under the previously programmed memory elements, as well as under the selected memory element and the unprogrammed and/or partially programmed memory elements. The increased pass voltage for the channel region associated with the previously programmed memory elements compensates for the effect of lower boosting due to the memory elements being in the programmed state. An exact compensation requires knowledge of which states the programmed memory elements are in. However, the number of programmed memory elements and the states to which they are programmed will be different for each NAND string. Generally, compensation in the range of approximately 2-3 V on the word lines associated with the previously programmed memory elements will optimally compensate for the average case when random data is written in the previously programmed memory elements. That is, $V_{pass1}$ should exceed $V_{pass2}$ by approximately 2-3 V. This differential can be optimized for specific memory devices by testing.

Note that the application of the above mentioned method is not limited to EASB, but can also be applied to the LSB as well as to variations of these methods. Generally, compensation is provided for the reduced boosting of the channel on the source side of the selected memory element, which is caused by some or all of the memory elements being in a programmed state. The compensation is provided by increasing the pass voltage for the word lines associated with the already programmed memory elements so that charge leakage between the two boosted regions is reduced or eliminated. As a result, the boosted channel potential under the selected word line and the word lines associated with the unprogrammed and/or partially programmed memory elements will be higher and almost independent of which word line is being programmed. Therefore, program disturb will be reduced and show less word line dependence. Moreover, due to the improved boosting, $V_{pass2}$ may be even lower. For example, in one possible approach, $V_{pass1}$ is approximately 10-11 V while $V_{pass2}$ is approximately 8 V, and $V_{pgm}$ can range from 16-24 V in successive pulses of increasing magnitude. Optimal levels for $V_{pass1}$ and $V_{pass2}$ for specific memory devices can be determined by testing. It is also expected that band-to-band tunneling will be reduced since the lateral electric field under the grounded word line will be reduced by this boosting technique. A further reduction of band-to-band tunneling may be accomplished by a boosting scheme as discussed in connection with FIG. 12.

Figure 12:
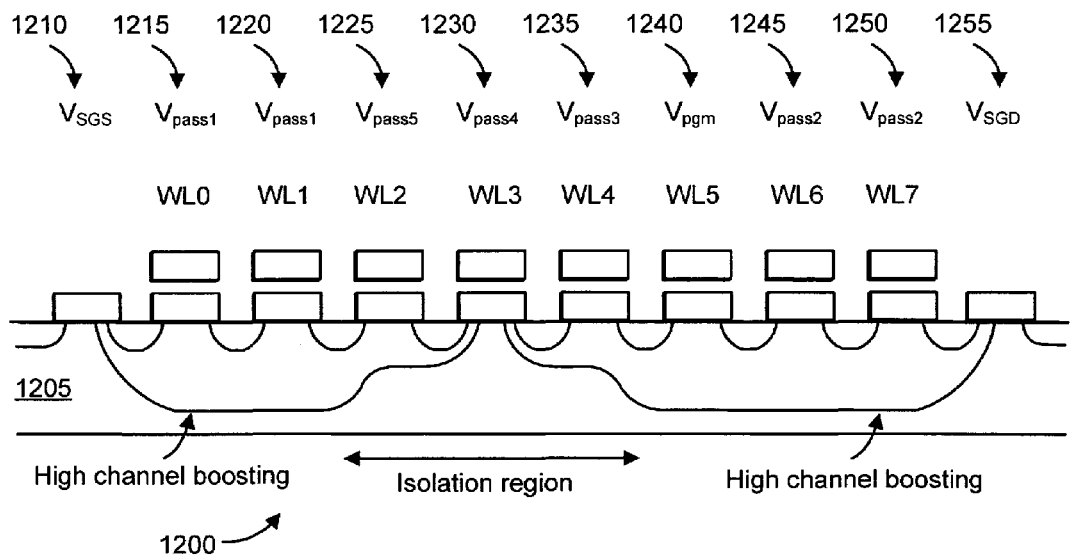
FIG. 12 illustrates a NAND string with an isolation region between boosted channel regions.

FIG. 12 illustrates a NAND string 1200 with an isolation region between boosted channel regions. The NAND string 1200 includes a source side select gate 1210, drain side select gate 1255, and memory elements 1215, 1220, 1225, 1230, 1235, 1240, 1245 and 1250, which are coupled to word lines WL0-WL7, respectively, between the select gates in a p-well region 1205. In this example, memory element 1240 is selected for programming, and it receives the programming voltage $V_{pgm}$ via word line WL5. A higher pass voltage $V_{pass1}$ is applied to one or more of the previously programmed memory elements, e.g., memory elements 1215 and 1220, via word lines WL-0 and WL1, respectively, while a lower or the same pass voltage $V_{pass2}$ is applied to the unprogrammed and/or partially programmed memory elements, e.g., memory elements 1245 and 1250, via word lines WL6 and WL7, respectively. Additionally, reduced pass voltages $V_{pass3}$, $V_{pass4}$ and $V_{pass5}$ are applied to previously programmed memory elements 1235, 1230 and 1225, via word lines WL4, WL3, and WL2, respectively, which are located between the selected memory element 1240, and the memory elements 1215 and 1220 which receive the higher pass voltage $V_{pass1}$. $V_{pass3}$, $V_{pass4}$ and $V_{pass5}$ are each less than $V_{pass1}$.

In one approach, $V_{pass4}$ is less than $V_{pass3}$ and $V_{pass5}$. $V_{pass3}$ and $V_{pass5}$ may be approximately equal to one another. Alternatively, $V_{pass3}$ and $V_{pass5}$ differ. For example, $V_{pass3}$ and $V_{pass5}$ may be approximately 2-4 V, while $V_{pass4}$ is approximately 0-1 V. As before, $V_{pass1}$ may be approximately 10-11 V while $V_{pass2}$ may be approximately 8 V, and $V_{pgm}$ can range from, e.g., 16-24 V in successive pulses. Optimal voltages may be determined for specific memory devices by testing. In this approach, the applied voltages essentially form a trough or isolation region which is centered about the memory element with the lowest applied pass voltage, e.g., memory element 1230, where the pass voltages increase symmetrically or asymmetrically on each side of the isolation region. The isolation region can include an odd or even number of memory elements. The isolation region serves to isolate the two highly boosted channel regions and to reduce the voltage on the drain and source area of the word line with the lowest bias voltage, e.g., word line WL3 associated with memory element 1230, to avoid or reduce band-to-band tunneling under that word line. A further embodiment with an alternative isolation region is provided in connection with FIG. 13.

Figure 13:
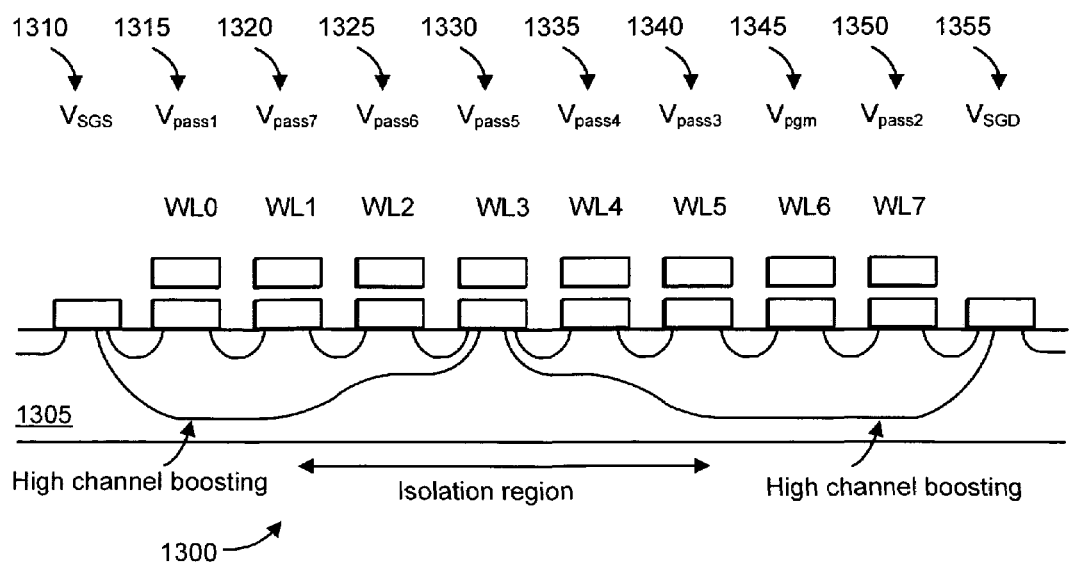
FIG. 13 illustrates a NAND string with an alternative isolation region between boosted channel regions.

FIG. 13 illustrates a NAND string 1300 with an alternative isolation region between boosted channel regions. The NAND string 1300 includes a source side select gate 1310, drain side select gate 1355, and memory elements 1315, 1320, 1325, 1330, 1335, 1340, 1345 and 1350 coupled to word lines WL0-WL7, respectively, between the select gates in p-well region 1305. In this example, memory element 1345 is selected for programming, and it receives programming voltage $V_{pgm}$ via word line WL6. A higher pass voltage $V_{pass1}$ is applied to one or more of the previously programmed memory elements, e.g., memory element 1315, via word line WL0, while a lower or the same pass voltage $V_{pass2}$ is applied to one or more unprogrammed and/or partly programmed memory elements, e.g., memory element 1350, via word line WL7. Additionally, reduced pass voltages $V_{pass3}$, $V_{pass4}$, $V_{pass5}$, $V_{pass6}$ and $V_{pass7}$ are applied to previously programmed memory elements 1340, 1335, 1330, 1325 and 1320, via word lines WL5, WL4, WL3, WL2, and WL1, respectively, which are between the selected memory element 1345 and the memory element 1315 which receives the higher pass voltage $V_{pass1}$.

In one approach, $V_{pass5}$ is less than $V_{pass3}$, $V_{pass4}$, $V_{pass6}$ and $V_{pass7}$. Additionally, $V_{pass4}$ and $V_{pass6}$ may be less than $V_{pass3}$ and $V_{pass7}$. $V_{pass3}$, $V_{pass4}$, $V_{pass5}$, $V_{pass6}$ and $V_{pass7}$ are less than $V_{pass1}$. $V_{pass4}$ and $V_{pass6}$ may be approximately equal to one another. Alternatively, $V_{pass4}$ and $V_{pass6}$ differ. Similarly, $V_{pass3}$ and $V_{pass7}$ may be approximately equal to one another. Alternatively, $V_{pass3}$ and $V_{pass7}$ differ. For example, $V_{pass3}$ and $V_{pass7}$ may be approximately 6-8 V, $V_{pass4}$ and $V_{pass6}$ may be approximately 2-4 V and $V_{pass5}$ may be approximately 0-1 V. As before, $V_{pass1}$ may be approximately 10-11 while $V_{pass2}$ may be approximately 8 V, and $V_{pgm}$ can range from, e.g., 16-24 V in successive pulses. Optimal voltages may be determined for specific memory devices by testing. In this approach, the applied voltages form an extended trough or isolation region which is centered about the memory element with the lowest applied pass voltage, e.g., memory element 1330, and which has a boosting profile that slopes more gently away from the isolation region as the pass voltages increase symmetrically or asymmetrically on each side of the isolation region. Moreover, the isolation region can include an odd or even number of memory elements. The isolation region serves to isolate the two highly boosted channel regions and to reduce the voltage on the drain and source areas of the word line with the lowest bias voltage, e.g., the word line WL3 associated with element 1330, to avoid or reduce band-to-band tunneling under that word line. By extending the length of the isolation region, the two highly boosted channel regions are further isolated to avoid or reduce leakage between the two boosted regions and to avoid or reduce band-to-band tunneling under that word line.

The above-mentioned program disturb reduction techniques are suitable for both multi-level and single-level programming. An increased benefit is expected for multi-level memories. For single-level memories, an increased benefit is expected to be realized when programming in a predetermined word line order from the source side to the drain side of a NAND string compared to random order programming. Moreover, the techniques can be used in principle with all boosting techniques. However, the most benefit is expected with multi-level boosting modes such as EASB and variants thereof.

As devices are scaled even further, these techniques can be further modified to address program disturb effects and related breakdowns. For example, significant benefits have been realized using these boosting techniques when scaling from 8-NAND strings to 16-NAND strings and to 32-NAND strings. Now the focus will move to longer strings, e.g., 64-NAND string, where a single bit line is in contact with 64 storage elements. Thus, program disturb is worse in longer strings, and the duration of program disturb is double that of 32-NAND strings, four times worse than 16-NAND strings, and eight times worse than 8-NAND strings.

Figure 14A:
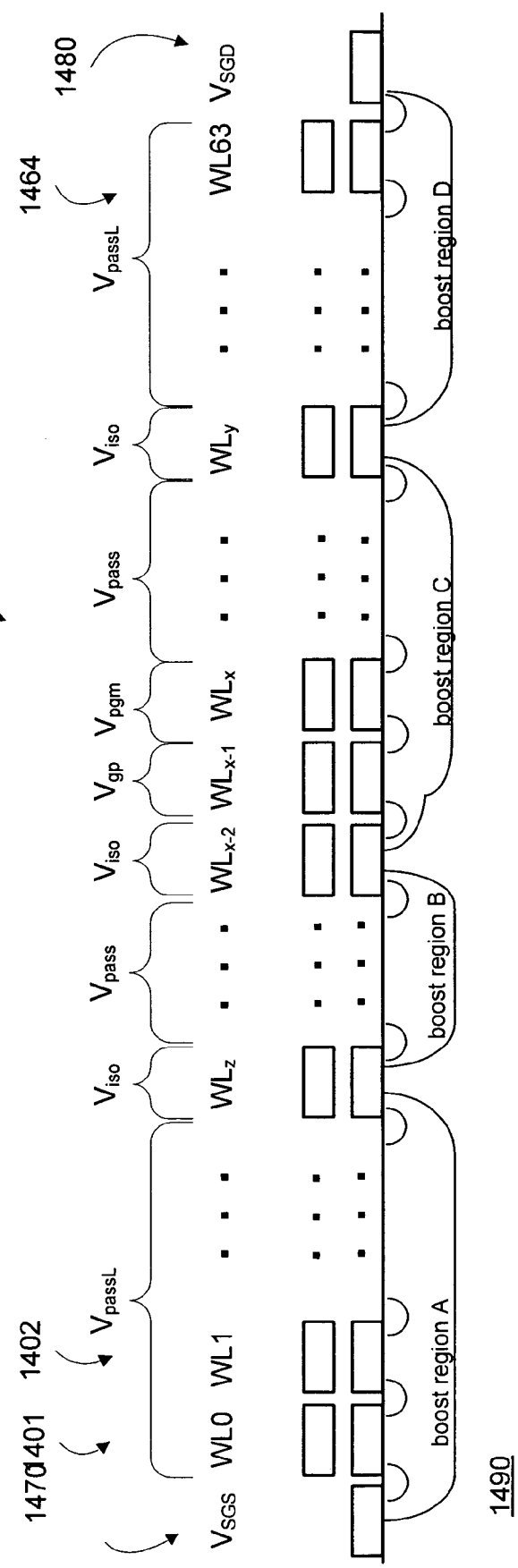
FIG. 14A illustrates the biasing of a 64-NAND string using additional isolation areas with a modified REASB technique.

FIG. 14A illustrates a NAND string 1400 with 64 memory elements. In this embodiment, additional isolation word lines are used to further divide the programmed and/or erased areas. The NAND string 1400 includes a source side select gate 1470 and a drain side select gate 1480, as well as memory elements 1401, 1402, . . . 1464, arranged in a p-well region 1490. Each memory element is selectable via a corresponding word line WL0, WL1 . . . WL63.

Assuming that word line $WL_x$ is selected for programming, then program voltage $V_{pgm}$ will be applied to that word line. On the source side of the selected memory element, an isolation region is created by applying a very low isolation voltage $V_{iso}$ (approx. 0-1V) to word line $WL_{x-2}$, and to alleviate gate induced leakage GIDL, an intermediate gate protect voltage (approx. 3V) $V_{gp}$ is applied to word line $WL_{1-1}$. At some predetermined distance from the selected memory element on the source side (programmed side), a secondary isolation region is created by applying the isolation voltage $V_{iso}$ to word line $WL_z$. Further, at some predetermined distance on the drain side (erased side), yet another secondary isolation region is created by applying the isolation voltage $V_{iso}$ to word line $WL_y$. In one preferred embodiment, reflected in FIG. 14B, the distance between the secondary isolation region and the selected memory is the same on both sides of the selected memory element, namely sixteen word lines. Other configurations could also be used, and optimal spacing for different device configurations can be determined through testing. Multiple isolation regions are thus created to define multiple boosting regions, which have been labeled region A, region B, region C, and region D. The preferred pass voltages to be applied in regions B and C is $V_{pass}$ (approx. 8V), and the preferred pass voltages to be applied in regions A and D is $V_{passL}$ (approx. 6-7V). Other voltages could be used. Most importantly, the voltages applied in regions A and D are lower than those applied in regions B and C. Program disturb is more severe at word lines on either edge of the NAND string, i.e., WL0, WL1, WL2 and WL61, WL62, and WL63 thus, the lower pass voltage $V_{passL}$ applied to the higher and lower word lines boosts channel voltage enough to substantially alleviate program disturb even if duration of program disturb is longer in the longer strings. Since the lower and higher word lines are boosted by $V_{passL}$, program disturb is substantially alleviated even for longer strings.

FIG. 14B shows an example of biasing conditions to be used in one example of this modified technique. The left-most column shows the word line selected for programming. The 64 columns to the right of the selected word line show the voltage to be applied to each word line for (in this example) up to the first twenty word lines. Thus, the first row (to the right of WL0) shows word line WL0 selected for programming and programming voltage $V_{pgm}$ applied to word line WL0. Since WL0 is the first word line nearest the source side, all other storage elements to the right are unprogrammed, and there is no isolation area created toward the source side of this first storage element. As described above, a secondary isolation area is created sixteen word lines away from the selected word line on the unprogrammed drain side by applying the isolation voltage $V_{iso}$ to word line WL15. As noted above, the boosting voltage $V_{pass}$ is applied to all word lines between the selected word line and the secondary isolation point (WL1-WL14), and a lower boosting voltage $V_{passL}$ is applied to all word lines beyond the second isolation point toward the drain (WL16-WL63).

When WL19 is selected for programming, for example, FIG. 14B shows that programming voltage $V_{pgm}$ is applied to WL19. Further, gate protect voltage $V_{gp}$ is applied to word line WL18 immediately adjacent to the selected word line on the source side, and isolation voltage Viso is applied to word line WL17, one word line removed from the selected word line on the source side. In addition, a secondary isolation region is created on the source side of the selected word line by applying the isolation voltage $V_{iso}$ to word line WL4, sixteen word lines away from the selected word line. Although not shown in FIG. 14B, another secondary isolation region is created on the drain side of the selected word line by applying the isolation voltage $V_{iso}$ to word line WL34, sixteen word lines away from the selected word line. Other variations could be used as well. For example, the gate protect voltage $V_{gp}$ could be applied to word lines on both sides of the word line to which the isolation voltage $V_{iso}$ is applied.

Figure 15A:
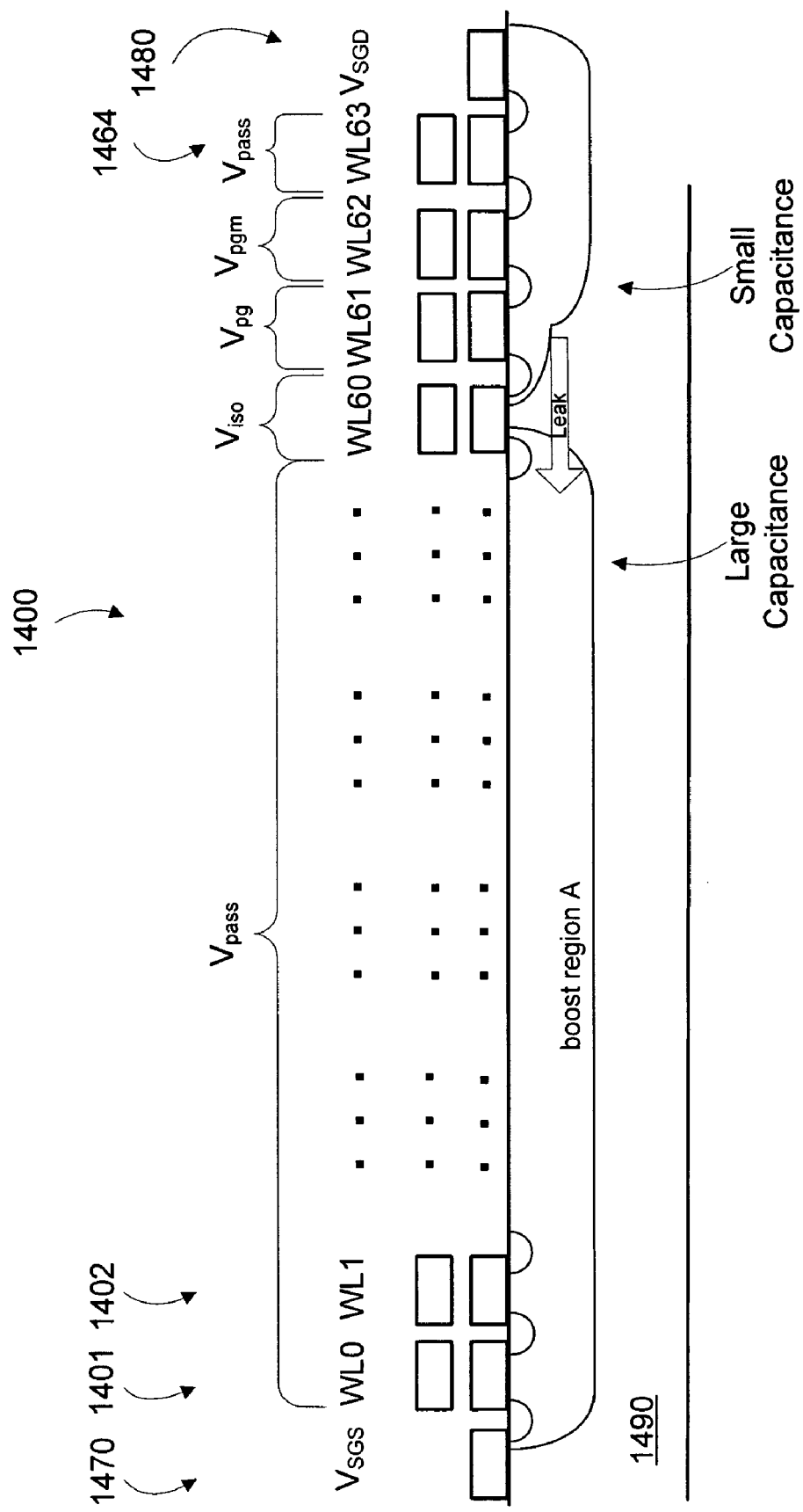
FIG. 15A illustrates the biasing of a 64-NAND string when programming the higher word lines using a conventional REASB technique.

FIG. 15A illustrates the biasing of a 64-NAND string 1500 when programming the higher word lines using a typical REASB technique with a single pass voltage. In this case, the program voltage $V_{pgm}$ is applied to word line WL62, the gate protect voltage $V_{gp}$ is applied to WL61, and the isolation voltage $V_{iso}$ is applied to word line WL60. The pass voltage $V_{pass}$ is applied to remaining word lines in both the programmed area (word lines WL0-WL59) and the erased area (word line WL63). However, under these biasing conditions, the effect of boosted voltage is weakened by the large channel capacitance on the programmed side and small channel capacitance on the erased side if the leakage current across the isolation area is large.

Figure 15B:
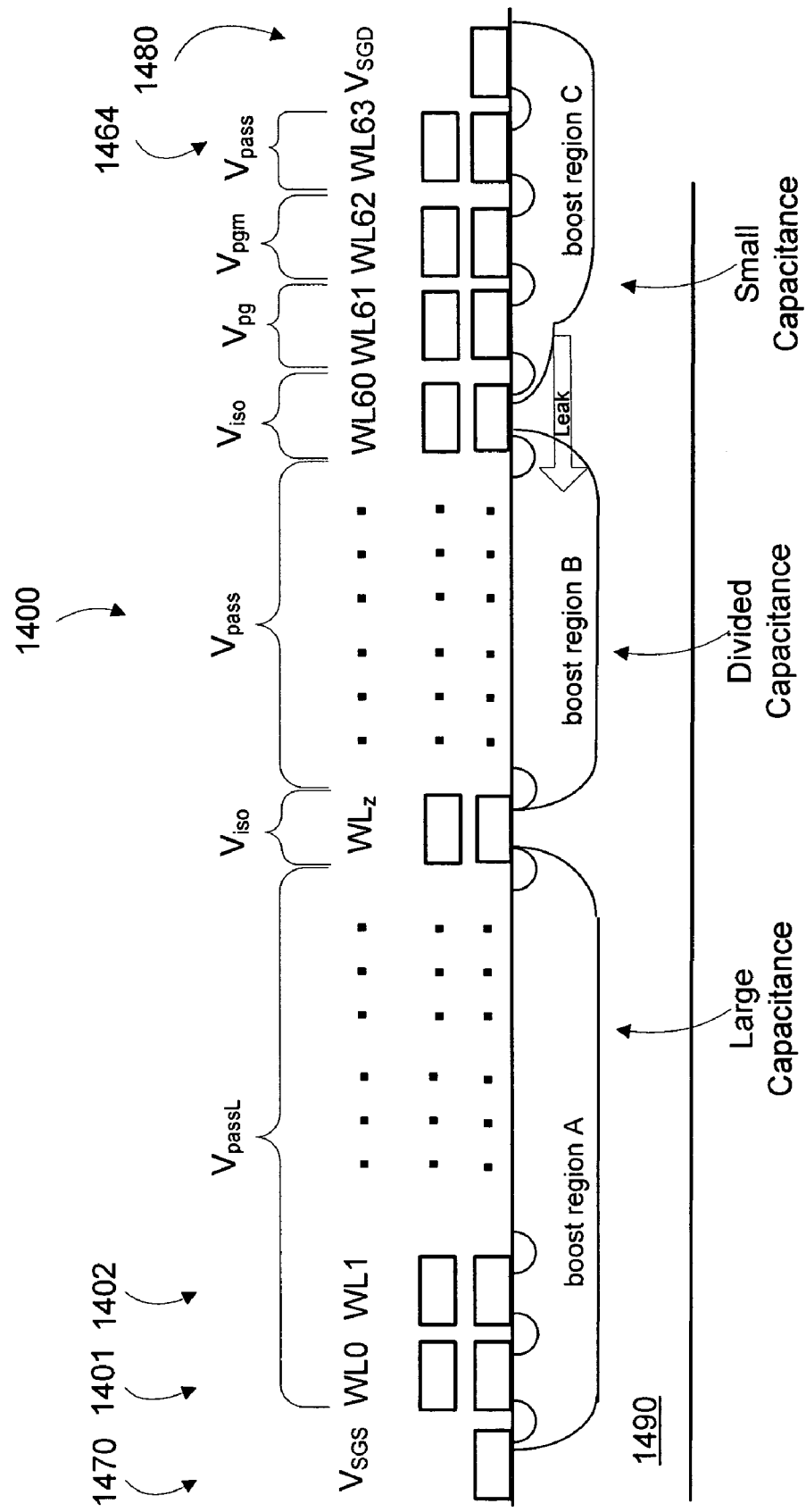
FIG. 15B illustrates the biasing of a 64-NAND string when programming the higher word lines using a modified REASB technique.

FIG. 15B illustrates a modified biasing technique that helps to limit the channel capacitance when programming the higher (or lower) word lines. The program voltage $V_{pgm}$ is again applied to word line WL62, the gate protect voltage $V_{gp}$ is applied to WL61, and the isolation voltage $V_{iso}$ is applied to word line WL60. A secondary isolation region is created on the programmed side by applying the isolation voltage $V_{iso}$ to word line $WL_z$, which is located some preset distance away from the selected word line, for example, 16 word lines in one embodiment. This effectively divides the programmed area into two isolated regions. A pass voltage $V_{pass}$ (approx. 8-10V) is applied to the word lines on both sides of the selected word line, e.g., $WL_{z+1}$ to WL59 and WL63, although the pass voltage need not be identical in both areas. A lower pass voltage $V_{passL}$ (preferably 1-2V less that $V_{pass}$) is applied to the remaining word lines on the source side of the secondary isolation region, e.g., WL0-$WL_{z-1}$. The capacitance on the programmed side is thus divided between the isolation areas, and leakage impact to the next region is limited.

Figure 16:
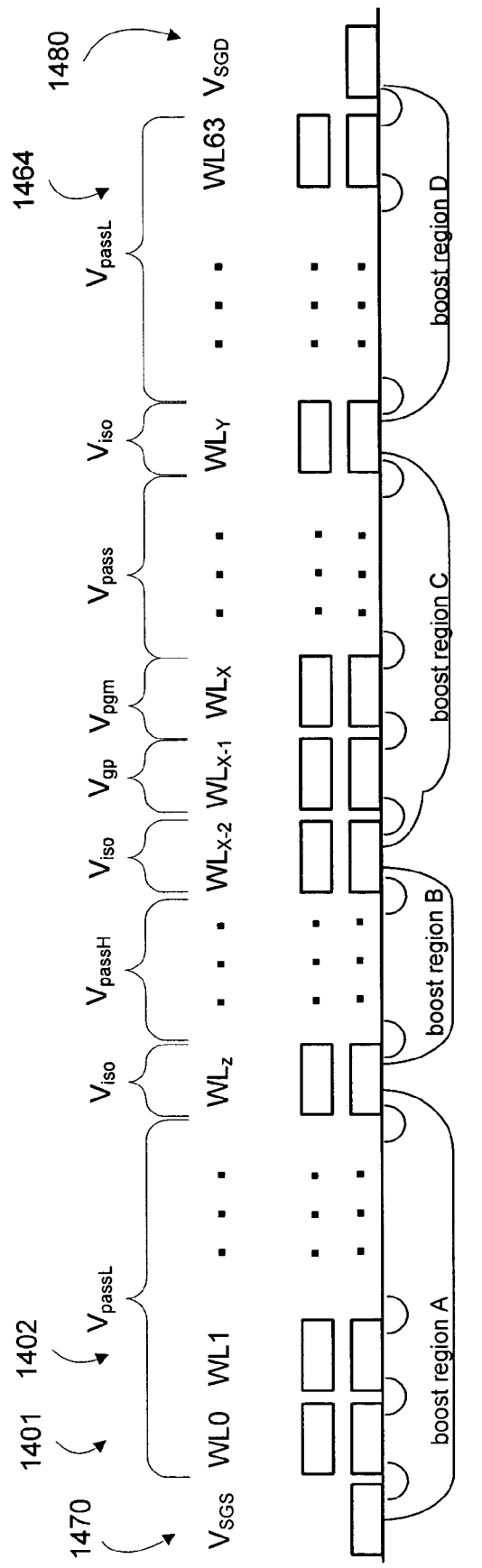
FIG. 16 illustrates the biasing of a 64-NAND string using a variation of the modified REASB technique.

FIG. 16 illustrates a variation on the modified biasing technique. Since the boosted channel voltage is typically lower in the programmed area due to programmed threshold voltages, a slightly higher pass voltage $V_{passH}$ is used to compensate for the reduced channel potential in region B.

Program voltage $V_{pgm}$ is applied to the selected word line $WL_x$. An isolation region is created by applying isolation voltage $V_{iso}$ to word line $WL_{x-2}$, and gate protect voltage $V_{gp}$ is applied to word line $WL_{x-1}$. Secondary isolation regions are created on both sides of the selected word line by applying the isolation voltage $V_{iso}$ to word lines $WL_z$ and $WL_y$. In this figure, the isolated boosting regions have been labeled region A, region B, region C, and region D. The standard pass voltage $V_{pass}$ (approx. 8-10V) is applied in region C. A slightly higher pass voltage $V_{passH}$ (approx. 1-2V higher than $V_{pass}$) is applied to word lines in the source-side boosting region B. (approx. 6-7V). A slightly lower pass voltage $V_{passL}$ (approx. 1-2V lower than $V_{pass}$) is applied in the remaining regions A and D. This arrangement compensates for the reduced channel potential in region B.

Figure 17:
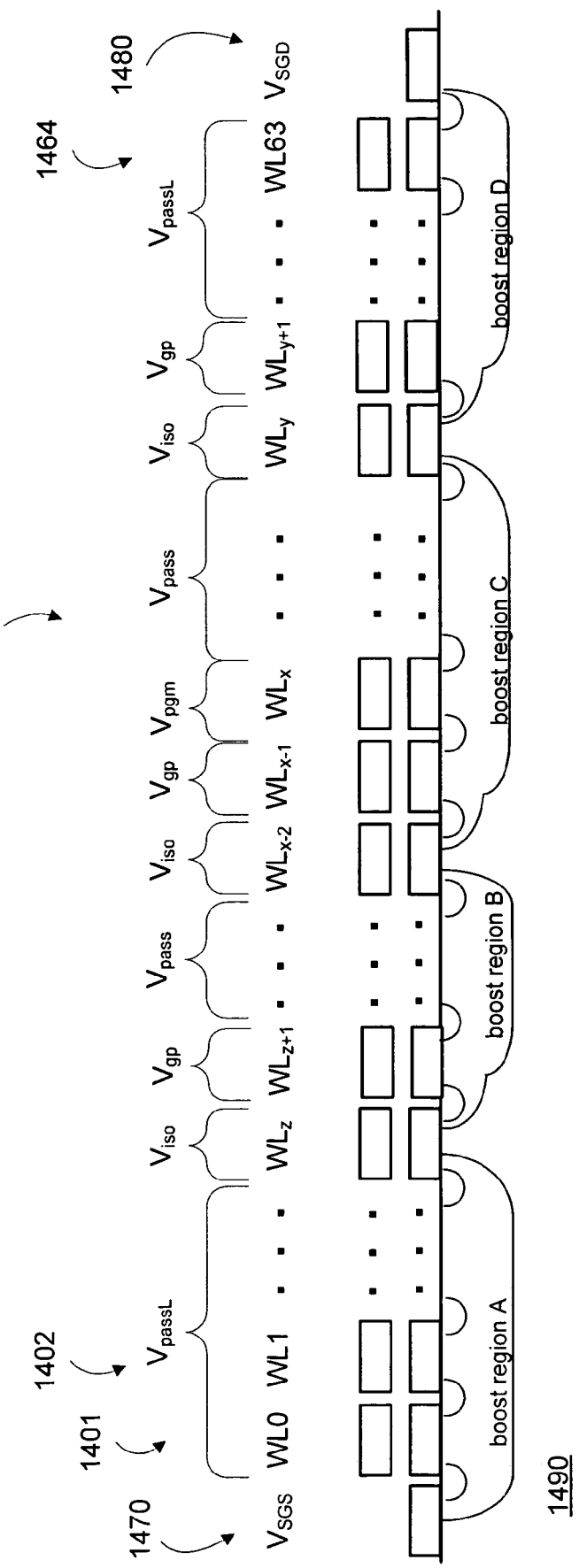
FIG. 17 illustrates the biasing of a 64-NAND string using another variation of the modified REASB technique.

FIG. 17 illustrates yet another variation on the modified biasing technique. This is similar to the configuration shown in FIG. 14A, except that more than one word line is used to create the secondary isolation regions. Thus, program voltage $V_{pgm}$ is applied to the selected word line $WL_x$. An isolation region is created by applying isolation voltage $V_{iso}$ to word line $WL_{x-2}$, and gate protect voltage $V_{gp}$ is applied to word line $WL_{x-1}$. Secondary isolation regions are created on both sides of the selected word line by applying the isolation voltage $V_{iso}$ to word lines $WL_z$ and $WL_y$, located at some distance away from the selected word line. In this embodiment, the secondary isolation is enhanced by applying the gate protect voltage $V_{gp}$ word lines $WL_{z+1}$ and $WL_{y+1}$. The pass voltage $V_{pass}$ is applied to word lines in regions B and C, while the lower pass voltage $V_{passL}$ is applied to word lines in regions A and D. This arrangement helps to reduce leakage current through the isolation region and GiDL in region B and D.

Other variations may also provide benefits. For example, a gate protect voltage $V_{gp}$ may be applied to word lines on both sides of the word line to which the isolation voltage $V_{iso}$ is applied, e.g., if $V_{iso}$ is applied to $WL_{x-2}$ and $WL_z$, then $V_{gp}$ is applied to $WL_{x-3}$ and $WL_{x-1}$, and to $WL_{z-1}$ and $WL_{z+1}$.

In another variation, a pass voltage is applied to the word line on the source side of the selected word line. Thus, if $V_{pgm}$ is applied to $WL_{62}$, for example, then $V_{pass}$ is applied to $WL_{61}$, $V_{gp}$ is applied to $WL_{60}$, and $V_{iso}$ is applied to $WL_{59}$.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

The invention claimed is:

1. A method for programming a set of non-volatile storage elements, comprising:
    isolating at least three channel regions associated with the non-volatile storage elements, wherein a first channel region and a second channel region are proximate to a selected storage element, and a third channel region is remote from the selected storage element;
    boosting a potential of each channel region, wherein the potential of the third channel region is boosted with a lower boosting voltage than the potentials of the first and second channel regions.

2. The method of claim 1, wherein the potentials of the first and second channel regions are boosted with a first boosting voltage and the potential of the third channel region is boosted with a second boosting voltage.

3. The method of claim 1, wherein the first and second channel regions are located on opposing sides of the selected storage element.

4. The method of claim 3, further comprising
boosting a potential of the first channel region using a third boosting voltage,
boosting a potential of the second channel region using a first boosting voltage, and
boosting a potential of the third channel region using a second boosting voltage,
wherein the third boosting voltage is greater than the first boosting voltage, and the first boosting voltage is greater than the second boosting voltage.

5. The method of claim 1, wherein the isolating step includes:
applying an isolation voltage to a first storage element located proximate to the selected storage element and to a second storage element located remote from the selected storage element.

6. The method of claim 5, wherein the isolating step further includes:
applying a gate protect voltage to a third storage element located immediately adjacent to the first storage element and to a fourth storage element located immediately adjacent to the second storage element.

7. The method of claim 5, wherein the isolating step further includes:
applying a gate protect voltage to third and fourth storage elements located immediately adjacent on opposite sides of the first storage element and to fifth and sixth storage elements located immediately adjacent on opposite sides of the second storage element.

8. A method for programming a set of non-volatile storage elements, comprising:
selecting a storage element for programming;
applying an isolation voltage to at least two storage elements located apart from each other thereby electrically dividing the set of storage elements into at least a first, a second, and a third subset of storage elements, wherein the first and second subsets are located proximate to the selected storage element and the third subset is located remote from the selected storage element; and
applying a distinct boosting voltage to each subset of the storage elements; wherein the boosting voltage applied to the third subset of storage elements is lower than the boosting voltages applied to the first and second subsets of storage elements.

9. The method of claim 8, further comprising:
applying the isolation voltage to a third storage element located remote from the selected storage element thereby further electrically dividing the set of storage elements into a fourth subset of storage elements, wherein the first and second subsets are proximate to the selected storage element and the third and fourth subsets are remote from the selected storage element; and
applying a distinct boosting voltage to the fourth subset of the storage elements, wherein the boosting voltages applied to the third and fourth subsets of storage elements are lower than the boosting voltages applied to the first and second subsets of storage elements.

10. The method of claim 8, further comprising:
applying a boosting voltage to storage elements located in the first subset of storage elements that is higher than the boosting voltage applied to storage elements located in the second subset of storage elements.

11. The method of claim 8, wherein a gate protect voltage is applied to at least two storage elements each located immediately adjacent to respective ones of the at least two storage elements to which the isolation voltage is applied.

12. The method of claim 8, wherein a gate protect voltage is applied to at least four more storage elements, which are paired immediately adjacent and on opposite sides of respective ones of the at least two storage elements to which the isolation voltage is applied.

13. The method of claim 8, wherein a gate protect voltage is applied to a first storage element located immediately adjacent to the selected storage element, and the isolation voltage is applied to a second storage element located immediately adjacent to the first storage element.

14. The method of claim 8, wherein a pass voltage is applied to a first storage element located immediately adjacent to the selected storage element, a gate protect voltage is applied to a second storage element located immediately adjacent to the first storage element, and the isolation voltage is applied to a third storage element located immediately adjacent to the second storage element.

15. A method for programming a set of non-volatile storage elements, comprising:
applying a programming voltage to a selected storage element;
electrically dividing a channel associated with the set of storage elements into at least three channel regions, wherein a first and second of the channel regions are proximate to the selected storage element and a third channel region is remote from the selected storage element; and
boosting a potential of each channel region, wherein the potential of the third channel region is boosted with a lower boosting voltage than the potentials of the first and second channel regions.

16. The method of claim 15, further comprising:
electrically dividing the channel into a fourth channel region, said fourth channel region being remote from the selected storage element; and
boosting a potential of the fourth channel region using a lower boosting voltage than is applied to boost the potentials of the first and second channel regions.

17. A method for programming a set of non-volatile storage elements arranged between a first select gate and a second select gate, comprising:
applying a programming voltage to a selected storage element;
applying an isolation voltage to at least two storage elements, a first of the storage elements located proximate to the selected storage element and a second of the storage elements located remote from the selected storage element, thereby electrically dividing a channel associated with the storage elements into at least three channel regions, wherein a first and second channel region are proximate to the selected storage element and a third channel region is remote from the selected storage element; and
applying a distinct boosting voltage to each of the storage elements, wherein a lower boosting voltage is applied to storage elements located in correspondence with the third channel region than is applied to storage elements located in correspondence with the first and second channel regions.

18. The method of claim 17, further comprising:
applying a gate protect voltage to a third storage element located adjacent to the first storage element and to a fourth storage element located adjacent to the second storage element.

19. The method of claim 18, wherein the isolation voltage is a low voltage and the gate protect voltage is an intermediate voltage.

20. The method of claim 19, wherein the isolation voltage is approximately zero volts and the gate protect voltage is approximately three volts.

21. The method of claim 17, further comprising:
applying an isolation voltage to a third storage element located remote from the selected storage element thereby electrically dividing the channel associated with the storage elements into at least four channel regions; and
applying a distinct boosting voltage to each of the storage elements, wherein a lower boosting voltage is applied to storage elements located in correspondence with the third and fourth channel regions than is applied to storage elements located in correspondence with the first and second channel regions.

22. A method for programming a set of non-volatile storage elements that are arranged between a first select gate and a second select gate, comprising:
selecting a storage element for programming;
electrically dividing a channel associated with the set of storage elements into at least thee channel regions, a first channel region being located proximate to the selected storage element on a side nearer the first select gate, a second channel region being located proximate to the selected storage element on a side nearer the second select gate, and a third channel region being located remote from the selected storage element;
boosting a channel voltage of the first and second channel regions with a first boost voltage; and
boosting a channel voltage of the third channel region with a second boost voltage;
wherein the first boosting voltage is greater than the second boosting voltage.

23. The method of claim 22, further comprising:
electrically dividing the channel into at least four channel regions, a fourth channel region being located remote from the selected storage element on a side nearer the second select gate, the third channel region being located on a side nearer the first select gate; and
boosting a channel voltage of the fourth channel regions with a third boost voltage,
wherein the third boosting voltage is greater than the first boosting voltage.

24. A system for programming a set of non-volatile storage elements, comprising:
a plurality of non-volatile storage elements;
a managing circuit in communication with the storage elements, wherein the managing circuit isolates at least thee channel regions associated with the non-volatile storage elements, wherein a first channel region and a second channel region are proximate to a selected storage element, and a third channel region is remote from the selected storage element, and boosts a potential of each channel region, wherein the potential of the third channel region is boosted with a lower boosting voltage than the potentials of the first and second channel regions.

25. The system of claim 24, wherein the potentials of the first and second channel regions are boosted by the managing circuit with a first boosting voltage and the potential of the third channel region is boosted with a second boosting voltage.

26. The system of claim 24, wherein the first and second channel regions are located on opposing sides of the selected storage element.

27. The system of claim 26, wherein the managing circuit boosts a potential of the first channel region using a third boosting voltage, boosts a potential of the second channel region using a first boosting voltage, and boosts a potential of the third channel region using a second boosting voltage, wherein the third boosting voltage is greater than the first boosting voltage, and the first boosting voltage is greater than the second boosting voltage.

28. The system of claim 26, wherein the managing circuit further isolates a fourth channel region, and boosts a potential of the fourth channel region using the second boosting voltage; wherein the fourth channel region is remote from the selected storage element and located adjacent to the third channel region, and wherein the third channel region is located adjacent to the first channel region.

29. The system of claim 24, wherein the managing circuit applies an isolation voltage to a first storage element located proximate to the selected storage clement and to a second storage element located remote from the selected storage element.

30. The system of claim 29, wherein the managing circuit applies a gate protect voltage to a third storage element located immediately adjacent to the first storage element and to a fourth storage element located immediately adjacent to the second storage element.

31. The system of claim 29, wherein the managing circuit applies a gate protect voltage to third and fourth storage elements located immediately adjacent on opposite sides of the first storage element and to fifth and sixth storage elements located immediately adjacent on opposite sides of the second storage element.

32. A system for programming a set of non-volatile storage elements, comprising:
a plurality of non-volatile storage elements;
a managing circuit in communication with the storage elements, wherein the managing circuit selects a storage element for programming, applies an isolation voltage to at least two storage elements located apart from each other thereby electrically dividing the set of storage elements into at least a first, a second, and a third subset of storage elements, wherein the first and second subsets are located proximate to the selected storage element and the third subset is located remote from the selected storage element, and applies a distinct boosting voltage to each subset of the storage elements, wherein the boosting voltage applied to the third subset of storage elements is lower that the boosting voltages applied to the first and second subsets of storage elements.

33. The system of claim 32, wherein the managing circuit applies the isolation voltage to a third storage element located remote from the selected storage element thereby further electrically dividing the set of storage elements into a fourth subset of storage elements, wherein the first and second subsets are proximate to the selected storage element and the third and fourth subsets are remote from the selected storage element, and applies applies a distinct boosting voltage to the fourth subset of the storage elements, wherein the boosting voltages applied to the third and fourth subsets of storage elements is lower that the boosting voltages applied to the first and second subsets of storage elements.

34. The system of claim 32, wherein the managing circuit applies a boosting voltage to storage elements located in the first subset of storage elements that is higher than the boosting voltage applied to storage elements located in the second subset of storage elements.

35. The system of claim 32, wherein the managing circuit applies a gate protect voltage to at least two storage elements each located immediately adjacent to respective ones of the at least two storage elements to which the isolation voltage is applied.

36. The system of claim 32, wherein the managing circuit applies a gate protect voltage to at least four more storage elements, which are paired immediately adjacent and on opposite sides of respective ones of the at least two storage elements to which the isolation voltage is applied.

37. The system of claim 32, wherein the managing circuit applies a gate protect voltage to a first storage element located immediately adjacent to the selected storage element, and the isolation voltage is applied to a second storage element located immediately adjacent to the first storage element.

38. The system of claim 32, wherein the managing circuit applies a pass voltage to a first storage element located immediately adjacent to the selected storage element, a gate protect voltage is applied to a second storage element located immediately adjacent to the first storage element, and the isolation voltage is applied to a third storage element located immediately adjacent to the second storage element.

39. A system for programming a set of non-volatile storage elements, comprising:
a plurality of non-volatile storage elements;
a managing circuit in communication with the storage elements, wherein the managing circuit applies a programming voltage to a selected storage element, electrically divides a channel associated with the set of storage elements into at least three channel regions, wherein a first and second of the channel regions are proximate to the selected storage element and a third channel region is remote from the selected storage element, boosts a potential of the first and second channel regions using a first boosting voltage, boosts a potential of each channel region, wherein the potential of the third channel regions is boosted with a lower boosting voltage than the potentials of the first and second channel regions.

40. The system of claim 39, wherein the managing circuit electrically divides the channel into a fourth channel region, said fourth channel region being remote from the selected storage element, and boosts a potential of the fourth channel region using a lower boosting voltage than is applied to boost the potentials of the first and second channel regions.

41. A system for programming a set of non-volatile storage elements arranged between a first select gate and a second select gate, comprising:
a plurality of non-volatile storage elements;
a managing circuit in communication with the storage elements, wherein the managing circuit applies a programming voltage to a selected storage element, applies an isolation voltage to at least two storage elements, a first of the storage elements located proximate to the selected storage element and a second of the storage elements located remote from the selected storage element, thereby electrically dividing a channel associated with the storage elements into at least three channel regions, wherein a first and second channel region are proximate to the selected storage element and a third channel region is remote from the selected storage element, applies a distinct boosting voltage to each of the storage elements, wherein a lower boosting boltage is applied to storage elements located in correspondence with the third channel region than is applied to storage elements located in correspondence with the first and second channel regions.

42. The system of claim 41, wherein the managing circuit applies a gate protect voltage to a third storage element located adjacent to the first storage element and to a fourth storage element located adjacent to the second storage element.

43. The system of claim 42, wherein the isolation voltage is a very low voltage and the gate protect voltage is an intermediate voltage.

44. The system of claim 43, wherein the isolation voltage is approximately zero volts and the gate protect voltage is approximately three volts.

45. The system of claim 41, wherein the managing circuit applies an isolation voltage to a third storage element located remote from the selected storage element thereby electrically dividing the channel associated with the storage elements into at least four channel regions; and applies a distinct boosting voltage to each of the storage elements, wherein a lower boosting voltage is applied to storage elements located in correspondence with the third channel region than is applied to storage elements located in correspondence with the first and second channel regions.

46. A system for programming a set of non-volatile storage elements that are arranged between a first select gate and a second select gate, comprising:
a plurality of non-volatile storage elements;
a managing circuit in communication with the storage elements, wherein the managing circuit selects a storage element for programming, electrically divides a channel associated with the set of storage elements into at least three channel regions, a first channel region being located proximate to the selected storage element on a side nearer the first select gate, a second channel region being located proximate to the selected storage element on a side nearer the second select gate, and a third channel region being located remote from the selected storage element, boosts a channel voltage of the first and second channel regions with a first boost voltage, boosts a channel voltage of the third channel region with a second boost voltage, wherein the first boosting voltage is greater than the second boosting voltage.

47. The system of claim 46, wherein the managing circuit further electrically divides the channel into at least four channel regions, a fourth channel region being located remote from the selected storage element on a side nearer the second select gate, the third channel region being located on a side nearer the first select gate, boosts a channel voltage of the fourth channel regions with a third boost voltage, wherein the third boosting voltage is greater than the first boosting voltage.

* * * * *

UNITED STATES PATENT AND TRADEMARK OFFICE
CERTIFICATE OF CORRECTION

PATENT NO.        : 7,440,326 B2
APPLICATION NO.   : 11/516976
DATED             : October 21, 2008
INVENTOR(S)       : Ito It is certified that error appears in the above-identified patent and that said Letters Patent is hereby corrected as shown below:

Column 26, line 53: After "applies" and before "a" delete --applies--

Signed and Sealed this

Fourteenth Day of April, 2009

JOHN DOLL
*Acting Director of the United States Patent and Trademark Office*